United States Patent [19]

Iwamura et al.

[11] Patent Number: 4,747,103
[45] Date of Patent: May 24, 1988

[54] SIGNAL PROCESSING APPARATUS FOR CORRECTING DECODING ERRORS

[75] Inventors: Keiichi Iwamura; Hideki Imai, both of Yokohama; Yasunori Dohi, Kawasaki, all of Japan

[73] Assignee: Canon Kabushiki Kaisha, Tokyo, Japan

[21] Appl. No.: 841,771

[22] Filed: Mar. 20, 1986

[30] Foreign Application Priority Data

Mar. 21, 1985 [JP] Japan .................................. 60-057048
Mar. 21, 1985 [JP] Japan .................................. 60-057049
Mar. 21, 1985 [JP] Japan .................................. 60-057050
Mar. 21, 1985 [JP] Japan .................................. 60-057051
Mar. 21, 1985 [JP] Japan .................................. 60-057052

[51] Int. Cl.[4] ............................................. G06F 11/10
[52] U.S. Cl. ..................................................... 371/37
[58] Field of Search ........................ 371/37, 38, 39, 40

[56] References Cited

U.S. PATENT DOCUMENTS 4,162,480  7/1979  Berlekamp ............................ 371/37
4,413,339 11/1983  Riggle et al. .......................... 371/38
4,498,175  2/1985  Nagumo et al. ....................... 371/37
4,527,269  7/1985  Wood et al. ...................... 371/37 X
4,583,225  4/1986  Yamada et al. ....................... 371/37
4,584,686  4/1986  Fritze .................................... 371/37

Primary Examiner—Charles E. Atkinson
Attorney, Agent, or Firm—Fitzpatrick, Cella, Harper and Scinto

[57] ABSTRACT

There is a signal processing apparatus for use in the error correction field for correcting errors in systems such as Reed Solomon code. This apparatus has three kinds of cells which execute the proceses in the decoding of the BCH code: namely, a syndrome cell to produce syndromes; a GCD (greatest common divisor) cell to produce an error position polynomial and an error evaluation polynomial; and an evaluation cell to estimate and correct errors in position and size. The required cells are one-dimensionally arranged in accordance with the error correcting capability of the code which is used. The algorithm for the signal processes in the conventional communication line is modified to the algorithm suitable for parallel processing. The signal processes can be executed using parallel processors due to the pipeline processes. Those dedicated cells can be realized by the hardwares, respectively. Each cell is controlled by only reference clock and synchronizing signal and the input and output data are time-sequentially multiplexed in the cell or process. Thus, this apparatus is fitted for multi-error correction and can be formed as an LSI because the circuit scale is small.

6 Claims, 21 Drawing Sheets

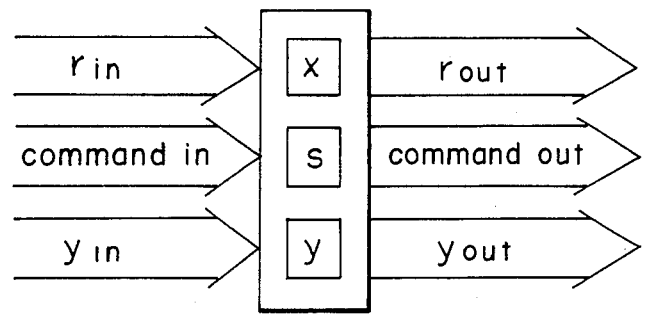
F I G. 3
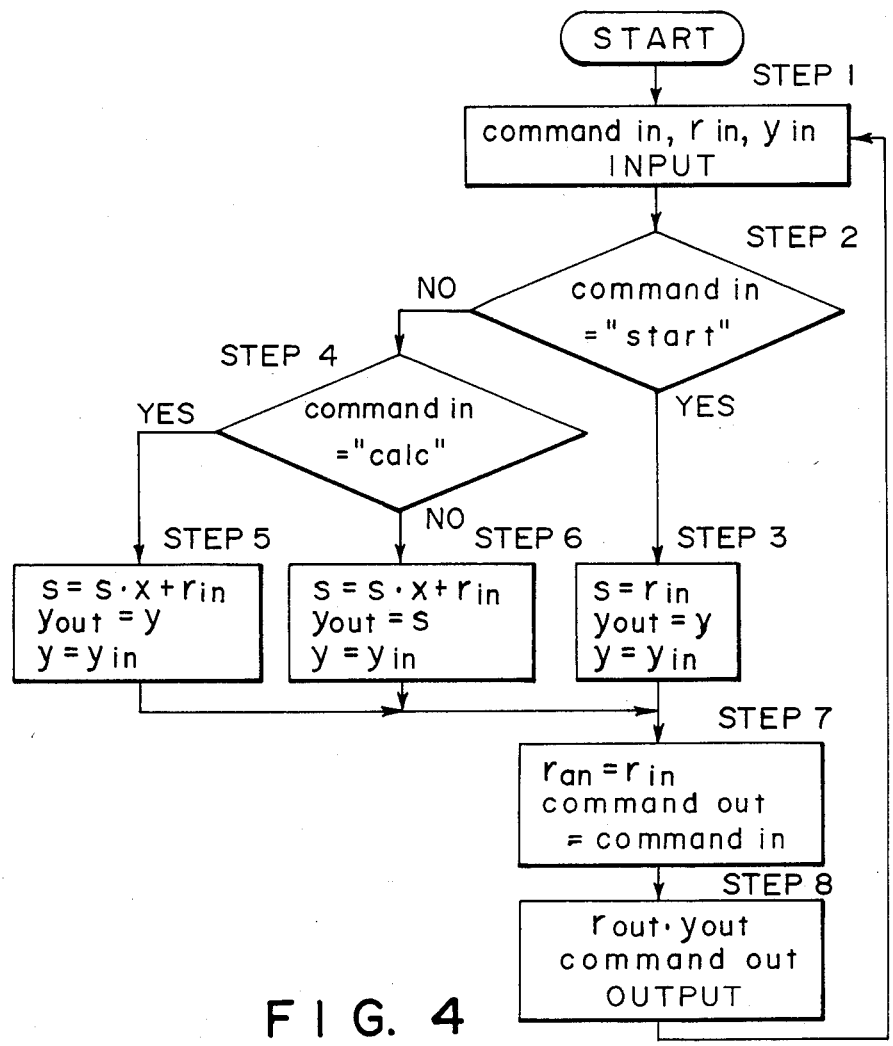
F I G. 4

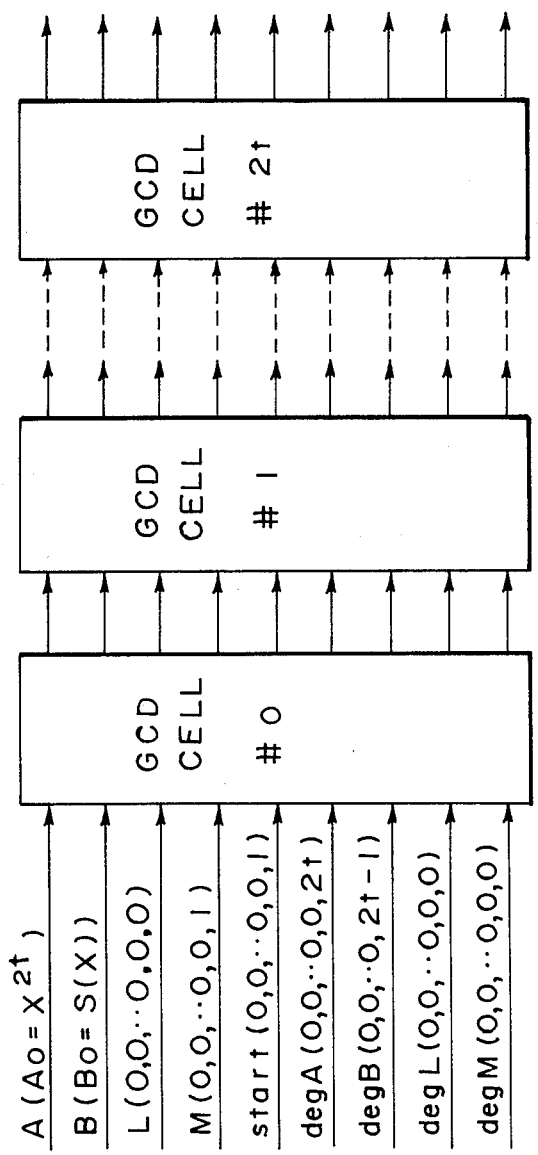
F I G. 15

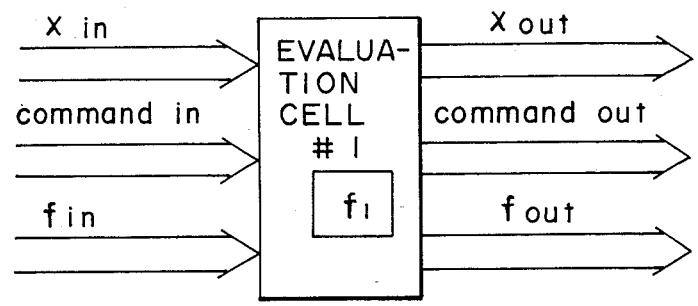
F I G. 18
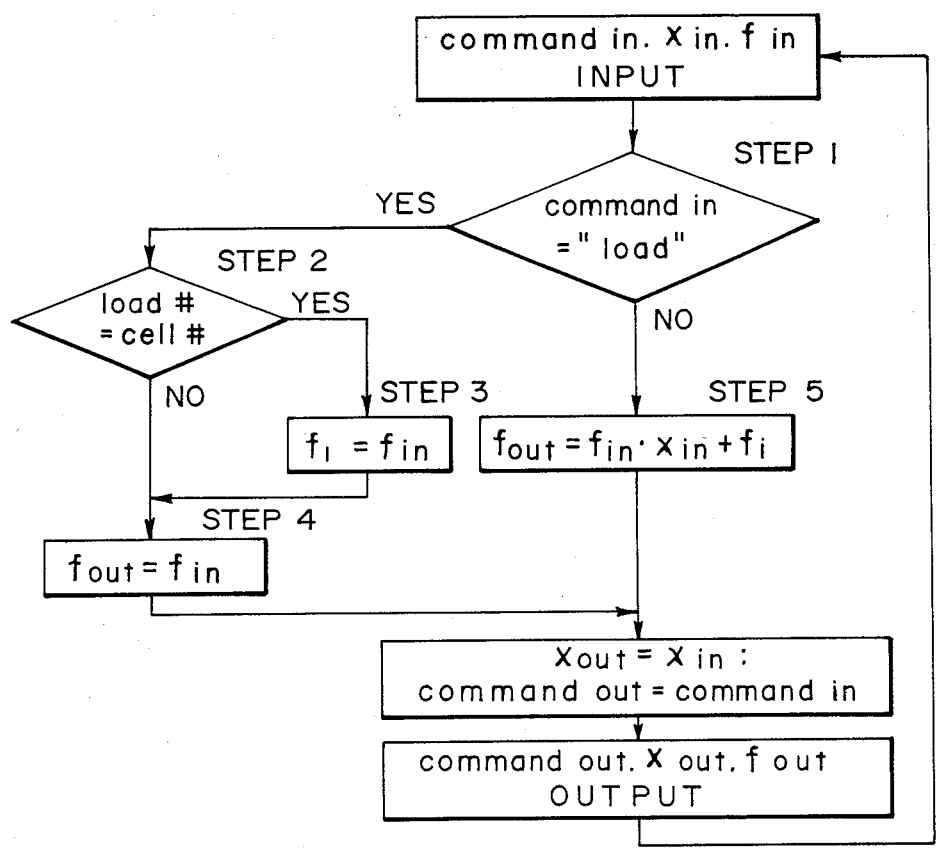
F I G. 19

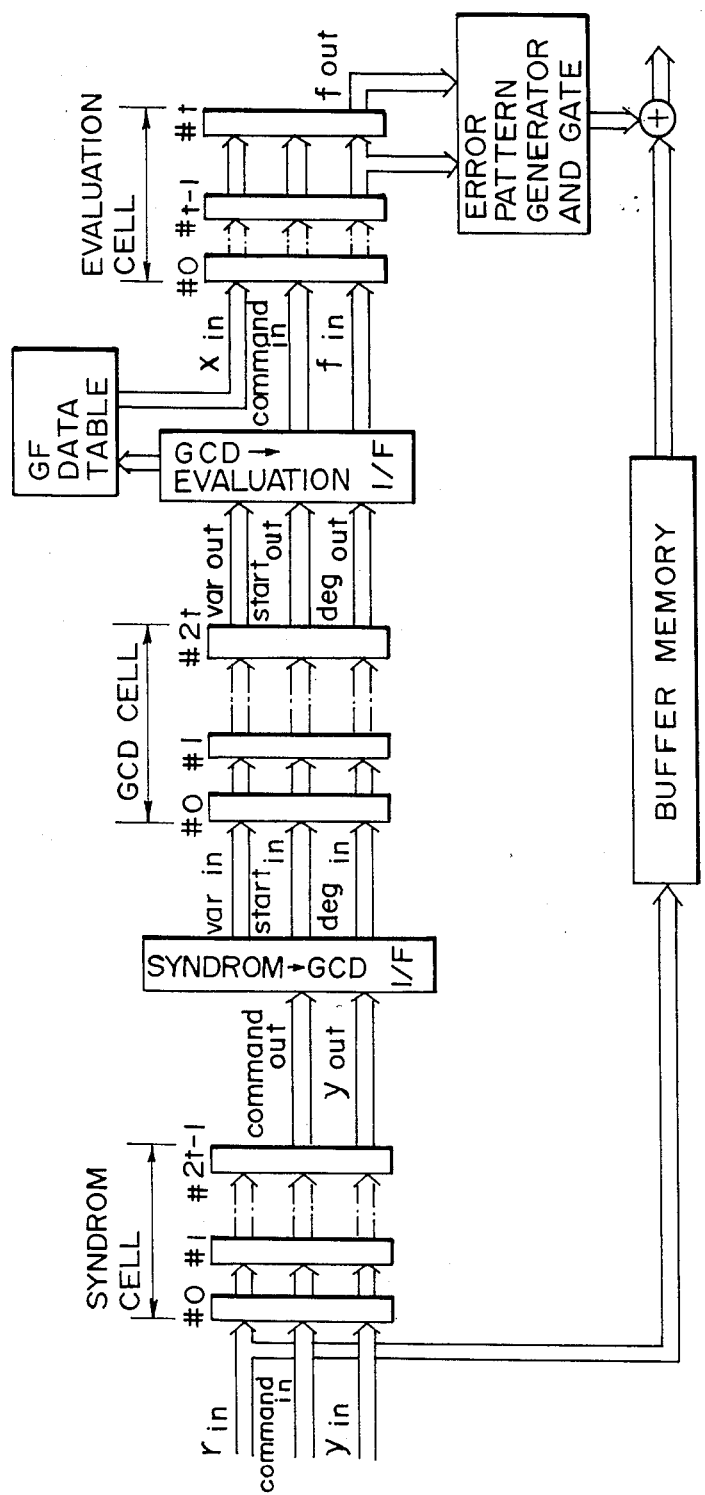
F I G. 23

SIGNAL PROCESSING APPARATUS FOR CORRECTING DECODING ERRORS

BACKGROUND OF THE INVENTION

1. Field of the Invention

The present invention relates to the error correction field and the technology to perform parallel processing in signal processing relating to communication lines.

The invention also relates to the technology to produce syndromes, GCD (greatest common divisor), and error correction in decoding of BCH (Bose-Chaudhuri-Hocqueghem) code.

The invention further relates to signal processing technology in which there are provided three kinds of cells to execute the respective steps of the production of syndromes, production of error position polynomials and error evaluation polynomials, and evaluation and correction of errors in position and size in decoding of BCH code. Only a predetermined number of cells among required cells are one-dimensionally arranged in accordance with the capability of the code.

2. Related Background Art

In recent years, in order to improve the reliability of various kinds of digital systems including the memory system, error detection-correction code (hereinafter, simply referred to as error correction code) has frequently been applied.

The error correction code includes various kinds of codes according to the system in which the error is detected and corrected. One class of linear codes called the cyclic code is the most typical one. This linear code contains BCH code suitable for the random error correction, Fire code suitable for the burst error correction, RS (Reed Solomon) code which is a type of BCH code and fitted for the byte error correction, and the like. Among them, the RS code has the feature such that the lowest redundancy can be obtained in the linear code having the same code length and correcting capability. Therefore, the RS code is widely used for satellite communications, magnetic disks, compact discs (hereinafter, abbreviated as a CD), and the like.

There are various kinds of methods of decoding the RS code and it is possible to provide a decoder for a code having a small correcting capability. However, to obtain high reliability, the correcting capability and code length needs to be enlarged. In this case, there are problems that the scale and control of the apparatus become fairly complicated and it requires a long calculating time for the decoding process. There are the Peterson system and Berlekamp-Massey system as the decoding system of the BCH code of the error correction code. Hitherto, the Peterson system has been used to decode the BCH code the necessary hardware when the correcting capability is low is relatively simple. On the contrary, in the case of providing hardware of the Berlekamp-Massey system, its constitution and control become extremely complicated, so that its realization is difficult.

Therefore, in the current CD system, a kind of double encoder called a CIRC is used and the decoding is performed on the basis of the Peterson system. However, in the case of using this method in the system which requires higher processing speed and high reliability, a problem occurs. In addition, there is the case where high processing speed and high reliability are needed in the communication line as well. It is often very difficult to provide the hardware for this type of communication line. Therefore, this line can be realized by using a simple system to constitute the hardware or limiting the correcting capability. For example in the encoding of the communication path, it is presently possible that up to a double correction of the RS (Reed Solomon) code can be realized.

Further, there is the problem that it takes a fairly long time to realize the foregoing process by the software, so that this method cannot be applied.

Due to the various kinds of problems as mentioned above, there is the problem that it is difficult to realize the RS decoding method having the high correcting capability and long code length and high reliability.

SUMMARY OF THE INVENTION

In consideration of the foregoing points, it is an object of the present invention to eliminate the conventional drawbacks by modifying the conventional algorithm of the signal process in the communication line to the algorithm suitable for the parallel process and by using a parallel processor.

On the other hand, although the parallel processing includes the complete parallel process, local parallel process, pipeline process, and the like, it is considered improper to merely apply a parallel processor to the conventional serial processing section. Therefore, the concept of the systolic algorithm is applied to the Berlekamp-Massey system. The practical algorithm which is actually applied to the decoder of the BCH code, GCD (greatest common divisor) section, or syndrome producing section is studied. The invention intends to design the dedicated cell to realize the hardware of that practical algorithm with respect to, particularly, the error evaluating and correcting sections.

BRIEF DESCRIPTION OF THE DRAWINGS

FIG. 3 is a block diagram showing a one syndrome cell;

FIG. 4 is a flowchart for explaining 'calc' of a command;

FIG. 15 is a block diagram in the case of practically designing the GCD cell;

FIG. 18 is a block diagram showing a fundamental model of the evaluation cell;

FIG. 19 is a flowchart showing the functional process of the fundamental model of the evaluation cell;

FIG. 23 is a diagram showing an arrangement of a decoder system of the RS code based on the systolic algorithm.

DETAILED DESCRIPTION OF THE INVENTION

Figure 1:
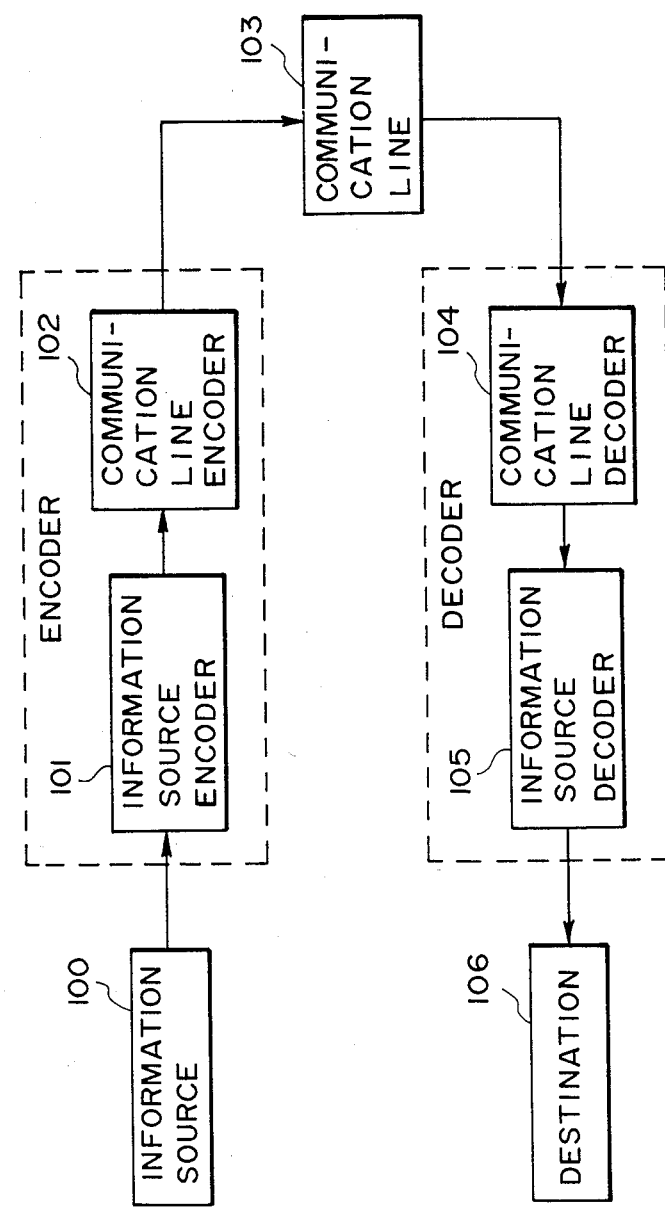
FIG. 1 is a block diagram showing a model of an encoder communication system.

FIG. 1 shows a model of a encoder communication system. Reference numeral 100 denotes an information source; 101 and 102 indicate sections to perform the encoding of the information source and communication line; 103 a communication line; 104 and 105 sections to execute the decoding of the information source and communication line; and 106 a destination of the communication.

Figure 2:
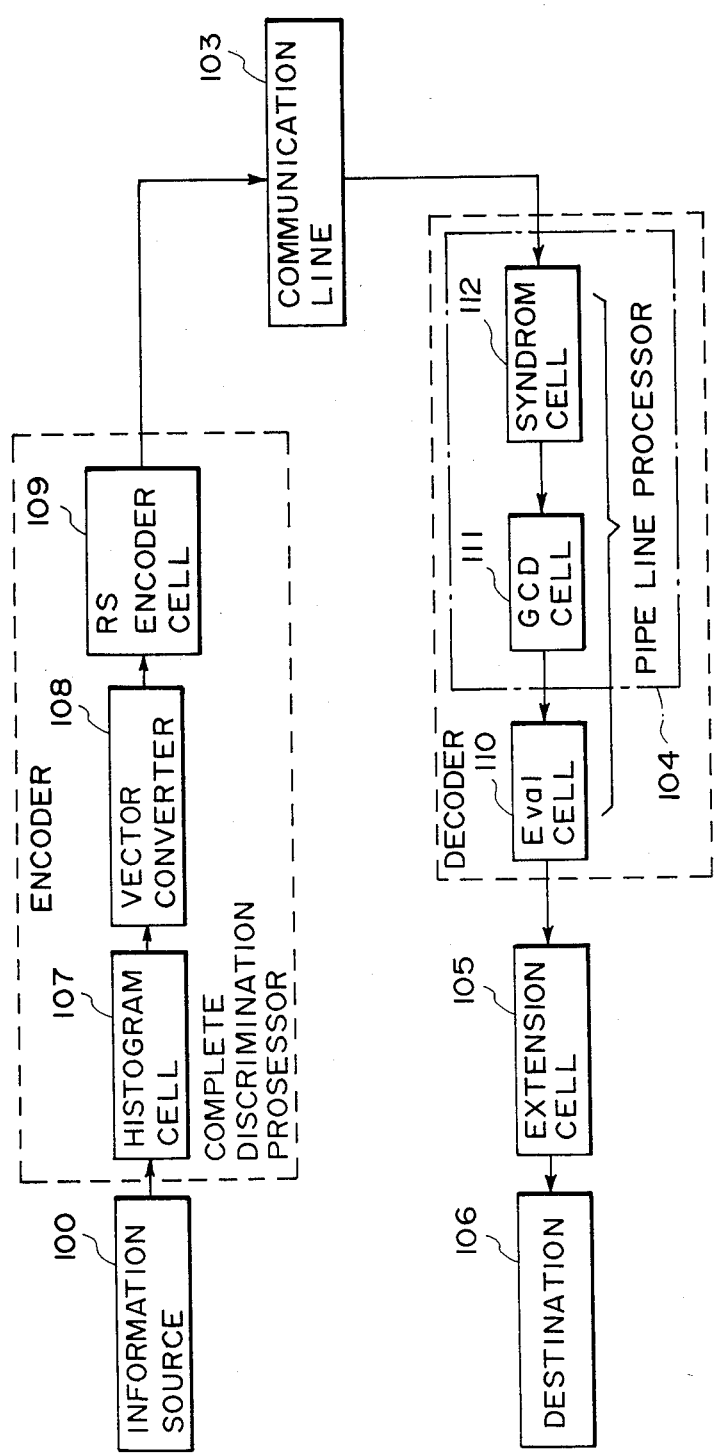
FIG. 2 is a block diagram for performing the parallel process by a parallel processor.

FIG. 2 shows a block diagram for executing parallel processing by a parallel processor to which the present invention is applied, in which the same parts and components as those in FIG. 1 are designated by the same reference numerals. Numeral 107 denotes a histogram cell and, for example, a complete parallel processor to produce a histogram regarding density information of image data. Numeral 108 denotes a vector converter cell to classify the data, e.g., "1, 2, 3, 4, 5, 6" from the histogram cell 107 into blocks such as "a" and "b", respectively, and thereby performing the vector conversion. Numeral 109 denotes an RS encoder cell to produce the foregoing RS code. The histogram cell 107, vecotr converter cell 108, and RS encoder cell 109 correspond to the encoding section in FIG. 1. Numerals 110, 111, and 112 respectively denote evaluation (Eval) cell, GCD cell, and syndrome cell and these cells constitute a pipeline processor corresponding to the decoding section in FIG. 1. Numeral 105 denotes an extension cell to extend the data compressed by the histogram cell 107 and vector converter cell 108. Due to this, it is possible to execute the process using the parallel processor in the signal process for the communication line. Only a predetermined number of cells among those cells can be one-dimensionally arranged in accordance with the correcting capability of the code and the decoding process can be performed on the basis of the pipeline process.

The principle regarding the pipeline process of the Eval cell 110, GCD cell 111, and syndrome cell 112 with respect to the RS code will then be described.

Principle of the RS Code

The principle of the RS code will be first described. The RS code has the feature such that the lowest redundancy can be obtained in the linear code having the same code length and correcting capability.

The RS code is the code in the special case of the non-two-dimensional BCH (Bose-Chaudhuri-Hocqueghem) code and constituted by the elements of a finite field (hereinafter, abbreviated as a GF) GF(q). In this case, q denotes the number of elements of GF(q).

By use of this q, various kinds of parameters to characterized the RS code are defined as follows.

Code length: n (number of symbols in one code)

$$n \leq q - 1 \qquad (2\text{-}1)$$

Number of information symbols: k (number of information symbols in one code)

Number of check symbols: n−k (number of check symbols in one code)

$$n - k = dmin - 1 \qquad (2\text{-}2)$$

Correcting capability: t (number of symbols in one code which can be corrected)

$$t = \left[ \frac{dmin - 1}{2} \right] \qquad (2\text{-}3)$$

([x]: Gauss' symbol—the maximum integer which doesn't exceed x)

dmin is the minimum distance called the hamming distance. This means that, for example, when two (n, k) RS code words (in each of which, the code length is n and the number of information symbols is k) F and G exist, $$F = (f_0, f_1, \cdots f_{n-1}) \qquad (2\text{-}4)$$

$$G = (g_0, g_1, \cdots g_{n-1}) \qquad (2\text{-}5)$$

(each symbol is the element of GF(q) by which the code is defined) and the symbols at the positions corresponding to F and G differ each other by an amount of at least dmin symbols.

On one hand, when errors E overlap the code word F and the reception words R are obtained, $$E = (e_0, e_1, \ldots e_{n-1}) \qquad (2\text{-}6)$$

$$\begin{aligned} R &= (r_0, r_1, \ldots r_{n-1}) & (2\text{-}7) \\ &= F + E & (2\text{-}8) \\ &= (f_0 + e_0, f_1 + e_1, \ldots f_{n-1} e_{n-1}) & (2\text{-}9) \end{aligned}$$

If the number of elements of non-zero of E, namely, the number of errors caused is t or less, R can be corrected by a decoding method, which will be explained hereinlater, and the correct code word F can be derived. However, ⎡ When errors of t + 1 or more are generated, the

| error correction is executed.

⎣ When errors of dmin or more are generated, there is a possibility such that the error detection is not executed as well.

(EXAMPLE)

It is now assumed that the number of errors generated in the RS code of dmin=5 (t=2) is l.

In the case where l=1: Single error can be corrected.

In the case where l=2: Double errors can be corrected.

In the case where $l \geq 3$: Errors can be detected. (However, there is a possibility such that the errors are misdetected as double errors.)

In the case where $l \geq 4$: Errors can be detected. (However, there is a possibility such that the errors are misdetected as a single error.)

In the case where $l \geq 5$: Errors can be detected. (However, there is a possibility such that it is determined that no error is detected.)

Therefore, the code must be designed in consideration of the points such that to which extent the error rate improvement rate is required in the system and to which extent the error correction is performed within the error correcting capability of the code.

Encoding

The polynomial expression of the code word and the like will be first explained.

For example, assuming that k information symbols which are desired to be encoded are $$I = (i_0, i_1, \cdots, i_{k-1}) \quad (2\text{-}10)$$

I is represented by the following polynomial expression.

$$I(X) = i_0 + i_1 x + i_2 x^2 + \ldots + i_{k-2} x^{k-2} + i_{k-1} x^{k-1} \quad (2\text{-}11)$$

Similarly, when (n−k) check symbols which are added assume $$C = (c_0, c_1, \cdots c_{n-k-1}) \quad (2\text{-}12)$$

C is represented by the following polynomial expression.

$$C(X) = c_0 + c_1 x + c_2 x^2 + \cdots c_{n-k-1} \cdot x^{n-k-1} \quad (2\text{-}13)$$

Further, when code words F consisting of those information and check symbols assume $$F = (f_0, f_1, f_2, \ldots f_{n-1}) \quad (2\text{-}14)$$
$$= c_0, c_1, \ldots c_{n-k-1}, i_0, i_1, i_2, \ldots k_{k-1}) \quad (2\text{-}15)$$

F is represented by the following polynomial expression.

$$F(X) = f_0 + f_1 x + f_2 x^2 + \cdots + f_{n-2} x^{n-2} + f_{n-1} X^{n-1} \quad (2\text{-}16)$$

Next, although the RS code is a kind of cyclic code as mentioned before, as an expression to characterize the cyclic code, there is a generating polynomial G(x) which is used when encoding/decoding. This generating polynomial has the degree equal to the number (n−k) of check symbols of the code and must be the polynomial can completely divide $(x^n-1)$. However, in the case of the RS code, either one of the following expressions is used.

$$G(x) = (x-\alpha)(x-\alpha^2) \cdots (x-\alpha^{n-k}) \quad (2\text{-}17)$$

$(G(x) = (x-1)(x-\alpha) \cdots (x-\alpha^{n-k-1})$ is also possible) (2-18)

$\alpha$ is a primitive element of the finite field GF(q) by which the code is defined.

The (n, k) RS code is obtained using the generating polynomial of (n−k) degree in accordance with the following procedure.

(i) The information symbol polynomial I(x) (expression (2-11)) is multiplied with $x^{n-k}$.

(ii) The remainder polynomial which is obtained by dividing $I(x) \cdot x^{n-k}$ by the generating polynomial G(x) assumes R(x).

$$I(x) \cdot x^{n-k} = Q(x) \cdot G(x) + R(x) \quad (2\text{-}19)$$

(iii) the R(x) is replaced by the check symbol polynomial C(x) and added to $I(x) \cdot x^{n-k}$ and the resultant code word polynomial assumes F(x).

$$F(x) = I(x) \cdot x^{n-k} - C(x) = Q(x) \cdot G(x) \quad (2\text{-}20)$$

It will be understood from expression (2-20) that the code word polynomial F(x) can be completely divided by the generating polynomial G(x) which is generated the polynomial F(x). However, the generating polynomial of expression (2-17) has the roots of $\alpha, \alpha^2, \cdots, \alpha^{n-k}$. Therefore, by substituting these roots for the code word polynomial F(x), the following expression is satisified.

$$F(\alpha^i) = 0 (i=1, 2, \cdots, n-k) \quad (2\text{-}21)$$

Expression (2-21) is represented by the following matrix expression. ($F^T$ is the transposed matrix of F)

$$H \cdot F^T = \begin{bmatrix} 1 & \alpha & \alpha^2 & \ldots & \alpha^{n-1} \\ 1 & \alpha^2 & \alpha^4 & \ldots & (\alpha^2)^{n-1} \\ \cdot & \cdot & \cdot & & \cdot \\ \cdot & \cdot & \cdot & & \cdot \\ \cdot & \cdot & \cdot & & \cdot \\ 1 & \alpha^{n-k} & (\alpha^{n-k})^2 & \ldots & (\alpha^{n-k})^{n-1} \end{bmatrix} \cdot \begin{bmatrix} c_0 \\ c_1 \\ \cdot \\ \cdot \\ c_{n-k-1} \\ i_0 \\ i_1 \\ \cdot \\ \cdot \\ i_{k-1} \end{bmatrix} = 0 \quad (2\text{-}22)$$

The matrix H of the left side is called the check matrix and has the significant meaning in the decoding as well.

Decoding Method

As already described above, since the RS code is one kind of BCH code, the decoding can be performed using the general decoding algorithm of the BCH code. Hoever, in this case, the symbols of addition, multiplication, and the like in the decoding process must be handled over the finite field GP(q) by which the RS code is defined.

When considering the RS code of the code length $n=2^m-1$ which is defined over $GF(2^m)$ (m is a positive integer), the symbol is expressed by an m-bit binary number and the calculation is executed over $GF(2^m)$. On one hand, it is assumed that the generating polynomial of expression (2-17) is used and the minimum distance (hamming distance) dmin of the code is set to $2t+1$ for simplicity.

The decoding procedure of such RS code is classified into the following four steps similarly to the case of the general BCH code.

step (1) Calculation of syndromes.
step (2) Production of the error position polynomial and error evaluation polynomial.
Step (3) Estimation of the error positions and error values.
Step (4) Execution of the error correction.

In the syndrome calculation in step 1 among those steps, only the operations to merely substitute the roots of the generating polynomial for the reception word polynomial and obtain the value thereof are executed as will be explained later. On the other hand, steps 2 and 3 are the most complicated steps in the decoding of the RS code and algorithm for this purpose mainly includes two kinds of Berlekamp-Massey method and Peterson method.

In the invention, the concept of the systolic algorithm is applied to each step and the three types of fundamental cells used to execute each step are realized as: Step (1) Syndrome cell; Step (2) GCD cell; and Steps (3) and (4) EVAL cell, respectively.

Step (1) Calculation of syndromes

First, similarly to expressions (2-4), and (2-6) to (2-9), it is assumed as follows.
The transmitted code words are F:

$$F=(f_0, f_1, \cdots f_{n-1})$$

The errors generated are E:

$$E=(e_0, e_1, \cdots e_{n-1})$$

The reception words received are R:

$$\begin{aligned} R &= (r_0, r_1, \ldots r_{n-1}) \\ &= F + E \\ &= (f_0 + e_0, f_1 + e_1, \ldots f_{n-1} + e_{n-1}) \end{aligned}$$

Then, the polynomial expression R(x) of the reception words is represented as follows.

$$\begin{aligned} R(x) &= F(x) + E(x) \\ &= (f_0 + e_0) + (f_1 + e_1)x + \ldots + \\ &\quad (f_{n-1} + e_{n-1})x^{n-1} \end{aligned} \quad (2\text{-}23)$$

However, when the roots $\alpha^i(i=1, \cdots, n-k)$ of the generating polynomial G(x) (expression (2-17)) are substituted for the code polynomial F(x) as shown in 2.2, $(F(\alpha^i)=0)$ in expression (2-21) is satisfied. Therefore, by similarly substituting $\alpha^i(i=1, \cdots, n-k)$ for the reception word polynomial R(x), the values which are determined by only the errors E are derived as follows.

$$R(\alpha^i)=F(\alpha^i)+E(\alpha^i)=0+E(\alpha^i)=E(\alpha^i) \quad (2\text{-}24)$$

These values are called syndromes and newly defined as follows.

$$S=(s_0, s_1, \cdots, s_{n-k-1}) \quad (2\text{-}25)$$

$$s_i=R(\alpha^{i+1})=E(\alpha^{i+1}) \ (i=0, 1, \cdots, n-k-1) \quad (2\text{-}26)$$

These syndromes include every information (positions and sizes of the errors) regarding the errors. (If no error is detected, the syndromes are 0; therefore, the presence or absence of the error can be detected.) The polynomial expression of the syndromes is as follows.

$$S(x)=s_0+s_1 x+\cdots+s_{n-k-1}x^{n-k-1} \quad (2\text{-}27)$$

Further, similarly to the case of expression (2-22), the syndromes (expressions (2-25) and (2-26)) are represented by the following matrix expression.

$$S = H \cdot R^T \ (R^T: \text{Transposed matrix of } R) \quad (2\text{-}28)$$

$$\begin{bmatrix} s_0 \\ s_1 \\ \cdot \\ \cdot \\ \cdot \\ s_{n-k-1} \end{bmatrix} = \begin{bmatrix} 1 & \alpha & \alpha^2 & \ldots & \alpha^{n-1} \\ 1 & \alpha^2 & \alpha^4 & \ldots & (\alpha^2)^{n-1} \\ \cdot & \cdot & \cdot & & \cdot \\ \cdot & \cdot & \cdot & & \cdot \\ \cdot & \cdot & \cdot & & \cdot \\ 1 & \alpha^{n-k} & (\alpha^{n-k})^2 & \ldots & (\alpha^{n-k})^{n-1} \end{bmatrix} \begin{bmatrix} r_0 \\ r_1 \\ \cdot \\ \cdot \\ \cdot \\ r_{n-1} \end{bmatrix} \quad (2\text{-}29)$$

Step (2) Production of the error position polynomial and error evaluation polynomial In step 2, the error position polynomial and error evaluation polynomial are produced using the syndromes as the result of the calculation in step 1. First, it is now assumed that the number of non-zero elements of the errors $E=(e_0, e_1, \cdots, e_{n-1})$, namely, the number of errors is $l$ ($1 \leq l \leq t$). It is also assumed that the errors are generated at the positions ju ($u=1, 2, \cdots, l$) ($j_u=0, 1, \cdots, n-1$) and the error at the position ju is $e_{ju}$. Further, expressions (2-2) and (2-3) assume $$n-k=dmin-1=2t \quad (2\text{-}30)$$

Then, the syndromes and sydrome polynomial of expressions (2-26) and (2-27) are expressed as follows.

$$s_i = E(\alpha^{i+1}) + \sum_{u=1}^{l} e_{ju}(\alpha^{i+1})^{ju}(i = 0, 1, \ldots, 2t - 1) \quad (2\text{-}31)$$

$$S(x) = \sum_{i=0}^{2t-1} s_i X^i = \sum_{u=1}^{l} e_{ju}\alpha^{ju} \sum_{i=0}^{2t-1} (\alpha^{ju})^i \cdot X^i \quad (2\text{-}32)$$

On the other hand, when it is assumed that $S\infty(x)$ is $S_\infty(x) = \sum_{i=0}^{\infty} s_i x^i$ (2-33)

the following expression is derived.

$$S_\infty(x) = \sum_{u=1}^{1} e_{ju}\alpha^{ju} \sum_{i=0}^{\infty} (\alpha^{ju})^i \cdot x^i \qquad (2\text{-}34)$$

$$= \sum_{u=1}^{1} e_{ju}\alpha^{ju} \frac{1}{1 - \alpha^{ju}x}$$

$$S(x) = [S_\infty(x)] \bmod x^{2t} \qquad (2\text{-}35)$$

The error position polynomial $\sigma(x)$ is defined as follows. The roots of this polynomial are the elements $\alpha^{-ju}$ of $GF(2^m)$ corresponding to the error positions ju (u=1, 2, ---, l) (ju=0, 1, ---, n=1) in the reception words.

$$\sigma(x) = (1 - \alpha^{j_1}x)(1 - \alpha^{j_2}x)\ldots(1 - \alpha^{j_u}x) \qquad (2\text{-}36)$$

$$= \prod_{u=1}^{l} (1 - \alpha^{ju}x)$$

Next, the error evaluation polynomial $\omega(x)$ for the above-mentioned polynomials $\sigma(x)$ and $S_\infty(x)$ is defined as follows.

$$\omega(x) = \sigma(x) \cdot S_\infty(x) = \sum_{u=1}^{l} e_{ju}\alpha^{ju} \qquad (2\text{-}37)$$

$$\left\{ \prod_{(k=1, k \neq u)} (1 - \alpha^{ju}x) \right\}$$

Thus, the following expression is satisfied from expressions (2-34), (2-35), and (2-37).

$$\sigma(x) \cdot S(x) = [\omega(x)] \bmod x^{2t} \qquad (2\text{-}38)$$

Therefore, the relation among $\sigma(x)$, $S(x)$, and $\omega(x)$ is expressed as follows using the proper polynomial $A(x)$.

$$A(x) \cdot x^{2t} + \sigma(x) \cdot S(x) = \omega(x) \qquad (2\text{-}39)$$

Now, since the number "1" of error is equal to or smaller than t, the polynomials $\omega(x)$ and $\sigma(x)$ satisfy the following relation.

$$\deg \omega(x) < \deg \sigma(x) \leq t \qquad (2\text{-}40)$$

Further, since $\omega(x)$ and $\sigma(x)$ are mutually prime (greatest common divisor (GCD) polynomial is a constant), $\omega(x)$ and $\sigma(x)$ which satisfy expressions (2-39) and (2-40) are unconditionally determined excluding the difference between their constant coefficients. Due to this, $\omega(x)$ and $\sigma(x)$ can be obtained by the process of Euclidean algorithm to derive the GCD polynomial of $x^{2t}$ and $S(x)$. The method of obtaining the GCD polynomial using the Euclidean algorithm will be briefly described hereinbelow. First, it is assumed that the GCD polynomial of two polynomials A and B is expressed by GCD [A, B]. On one hand, for the polynomials A and B, the polynomials $\overline{A}$ and $\overline{B}$ are defined as follows.

When $\deg A \geq \deg B$, $A = A - A \cdot B^{-1} \cdot B$ (2-41)

$B = B$ (2-42)

When $\deg A \geq \deg B$, $A = A$ (2-43)

$B = B - B \cdot A^{-1} \cdot A$ (2-44)

($X \cdot Y^{-1}$ : Quotient of the division of the polynomial $X$ by the polynomial $Y$ as a divisor)

In this case, GCD [A, B] and GCD [$\overline{A}$, $\overline{B}$] satisfy the following expression.

$$GCD[A,B] = GCD[\overline{A}, \overline{B}] \qquad (2\text{-}45)$$

Therefore, the polynomials A and B are newly replaced by A, B and expressions (2-41) and (2-42) or expressions (2-43) and (2-44) are transformed in accordance with the magnitude between their respective degrees degA and degB. By repeating these operations, when either A or B becomes the zero polynomial, the other non-zero polynomial is obtained as the GCD polynomial of A and B. Obtaining the GCD polynomial of the polynomials A and B means that the following polynomials C and D are derived. In this case, deg denotes a degree.

$$GCD[A,B] = C \cdot A + D \cdot B \qquad (2\text{-}46)$$

In the process to execute the above repetitive steps and obtain the GCD polynomial of the polynomials A and B having the relation of $i = \deg A \geq \deg B$ between their degrees, the polynomials C, D, and W which satisfy the following expressions can be obtained.

$$\begin{bmatrix} \deg W < j \ (j \leq i), \deg D \leq i - j \\ (i \text{ and } j \text{ are positive integers}) \\ C \cdot A + D \cdot B = W \end{bmatrix} \qquad (2\text{-}47)$$

The problem to obtain such polynomials is called an extension GCD problem. Therefore, the error position polynomial $\sigma(x)$ and error evaluation polynomial $\omega(x)$ can be obtained by solving the extension GCD problem in the case where $x^{2t}$ is substituted for the polynomial A and S(x) is substituted for the polynomial B in expression (2-47).

Step (3) Estimation of the error positions and error values

In step 3, the error positions and error values are estimated from the error position polynomial $\sigma(x)$ and error evaluation polynomial $\omega(x)$ obtained in step 2. First, the elements $\alpha^{-i}$ of $GF(2^m)$ corresponding to the positions i=0, 1, ---, n−1 of the symbols in the reception words R=($r_0, r_1, ---, r_{n-i}$) are sequentially substituted for the error position polynomial $\sigma(x)$. In this case, if $\sigma(\alpha^{-i}) = 0$ is satisfied from expression (2-36), it will be understood that $\alpha^{-i} = \alpha^{-ju}$ is satisfied between i and error positions ju. (ju=0, 1, ---, n−1; u=1, 2, ---, l, 1 ≦t). The value of the error evaluation polynomial $\omega(x)$ for such an equation $\alpha^{-1} = \alpha^{-ju}$ is as follows.

$$\omega(\alpha^{-ju}) = eju \cdot \alpha^{ju} \cdot \left\{ \frac{1}{\pi_{(k=1,K\neq u)}} (1 - \alpha^{ju} \cdot \alpha^{-ju}) \right\} \quad (2\text{-}48)$$

Further, assuming that $\sigma'(x)$ is the differential of $\sigma(x)$, the following expression is satisfied.

$$\sigma'(\alpha^{-ju}) = -\alpha^{ju} \cdot \left\{ \frac{1}{\pi_{(k=1,K\neq u)}} (1 - \alpha^{ju} \cdot \alpha^{-ju}) \right\} \quad (2\text{-}49)$$

Therefore, the error values $e_{ju}$ at the error positions ju can be obtained from expressions (2-48) and (2-29) as follows.

$$eju = \frac{\omega(\alpha^{-ju})}{\sigma'(\alpha^{-ju})} \quad (2\text{-}50)$$

Step (4) Execution of the error correction

From expression (2-9), the reception symbols $r_{ju}$ at the positions ju where the errors are generated are represented by the following expression by use of the symbols $f_{ju}$ of the inherent code words and the error sizes $e_{ju}$.

$$f_{ju} = r_{ju} - e_{ju} \quad (2\text{-}51)$$

Therefore, in step 4, at the positions i (i=0, 1, - - -, n=1) where the result of the execution of step 3, i.e., $\sigma(\alpha^{-i})=0$ is satisfied, $$e_i = \frac{\omega(\alpha^{-i})}{\sigma'(\alpha^{-i})} \quad (2\text{-}52)$$

are subtracted from the reception symbols $r_i$ (over $GF(2^m)$)

$$f_i = r_i - e_i \quad (2\text{-}53)$$

thereby executing the error correction at the positions i.

Syndrome cell

The syndrome cell to calculate the syndromes in step 1 mentioned before will then be described.

As shown in the description of the calculation of the syndromes, in the decoding step 1, the coefficients $(s_{2t-1}, ---, s_1, s_0)$ of the syndrome polynomial which is used in step 2 are derived from the reception series $R(r_{n-1}, ---, r_1, r_0)$ on the basis of expression (2-29). The function which is required for the syndrome cell array to realize it is to give the coefficients $(s_{2t-1}, ---, s_1, s_0)$ from the input data $(r_{n-1}, ---, r_1, r_0)$ to the GCD cell side in accordance with this sequence. As will be understood from expression (2-29) as well, the practical calculation of the coefficients of the syndrome polynomial is replaced by the steps such that the coefficients (reception symbols $r_{n-1}, ---, r_1, r_0$) are given to the polynomial (reception polynomial R(x)) in which the values ($\alpha^{i+1}$ corresponding to $s_i(i=0, 1, ---, 2_{t-1})$) of the variables x to be substituted are known, and these values are solved by the repetitive algorithm as shown in the following expression.

$$Si = \{ \ldots [r_{n-1} \cdot \alpha^{i+1} + r_{n-2}) \cdot \alpha^{i+1} + r_{n-3}] \cdot \quad (5\text{-}10)$$

-continued $$\alpha^{i+1} + \ldots + r_1 \cdot \alpha^{i+1} + r_0$$

Although this algorithm has the same form as the systolic algorithm to solve the DFT (discrete Fourier transformation), it cannot be applied as it is since the coefficients are not known preliminarily. Therefore, to solve this algorithm, one of the calculations of the coefficients $s_i(i=0, 1, ---, 2_{t-1})$ of the syndrome polynomial must be assigned to one cell as shown in FIG. 3.

In FIG. 3, x denotes $\alpha^{i+1}$ (values to be substituted for the polynomial) corresponding to $s_i$; s represents a register to store the intermediate result ($s_i$) of the calculation; and y indicates a delay necessary to transfer the result of the calculation. In addition, $r_{in/out}$ denotes I/O ports of the coefficient data $(r_{n-1}, ---, r_1, r_0)$; $y_{in/out}$ indicates I/O ports of the result of the calculation; and command$_{in/out}$ represents I/O ports of commands to inform the beginning and end of data to the cell. Each cell sequentially receives the data $r_{n-1}, ---, r_1, r_0$ and repeatedly executes the sum of products calculation of expression (5-10) and outputs the result of the calculations after it was repeated n times. Three kinds of "commands" are considered. First, "start" indicates the beginning of the input data. When the cell receives this "start" command, it initializes the "s" register. The sum of products calculation is executed once in response to the "calc" command. After completion of the sum of products calculation, the result of the calculations is output in response to the "end" command. This function is as shown in FIG. 4 and its details will be explained later.

Connection of the syndrome cell

Figure 5:
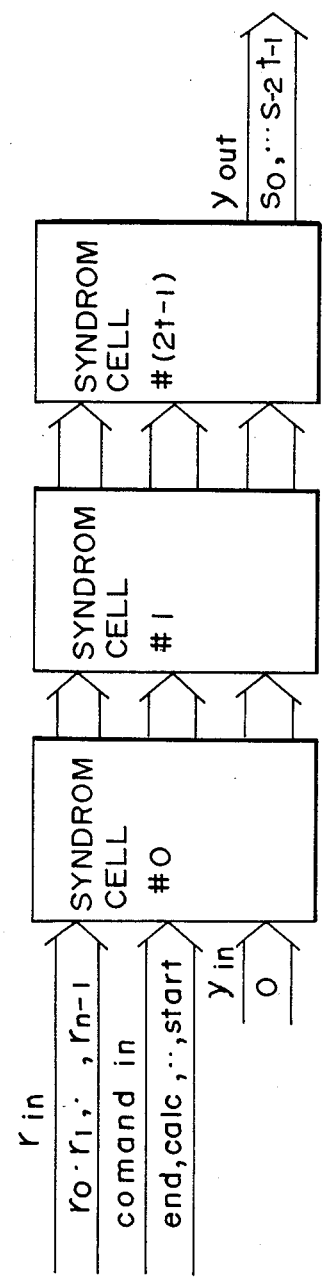
FIG. 5 is a block diagram showing the connection of a plurality of syndrome cells.

One of the calculations of the coefficients $s_i(i=0, 1, ---, 2_{t-1})$ of the syndrome polynomial is assigned to one syndrome cell shown above, so that the total 2t syndromes are necessary. On one hand, when considering the interface with the GCD cell array, each $s_i$ must be output from the higher order term. Therefore, as shown in FIG. 5, the syndrome cells must be one-dimensionally connected from the cell to calculate the low-order (#0) term. At this time, there is the delay time corresponding to (N+2t) symbol cycles for the interval from the start of input of the data $r_{n-1}$ into the leftmost cell until the start of output of the result of the calculation $(s_{2t-1}, ---, s_1, s_0)$ from the rightmost cell (where, one symbol cycle corresponds to the input cycle of $r_j(j=n-1, ---, 1, 0)$).

It is sufficient to finally output the result of the calculation from the cell of #2t−1. It is enough that the first input data has a predetermined value. However, "0" must be continuously inputted to the input port $y_{in}$ of the leftmost syndrome cell ($s_0$). As will be understood from expression (5-10), the reception symbols $r_j(j=n-1, ---, 1, 0)$ must be input into the syndrome cell array from the high order term of the reception word polynomial.

Practical design of the syndrome cell

Figure 6:
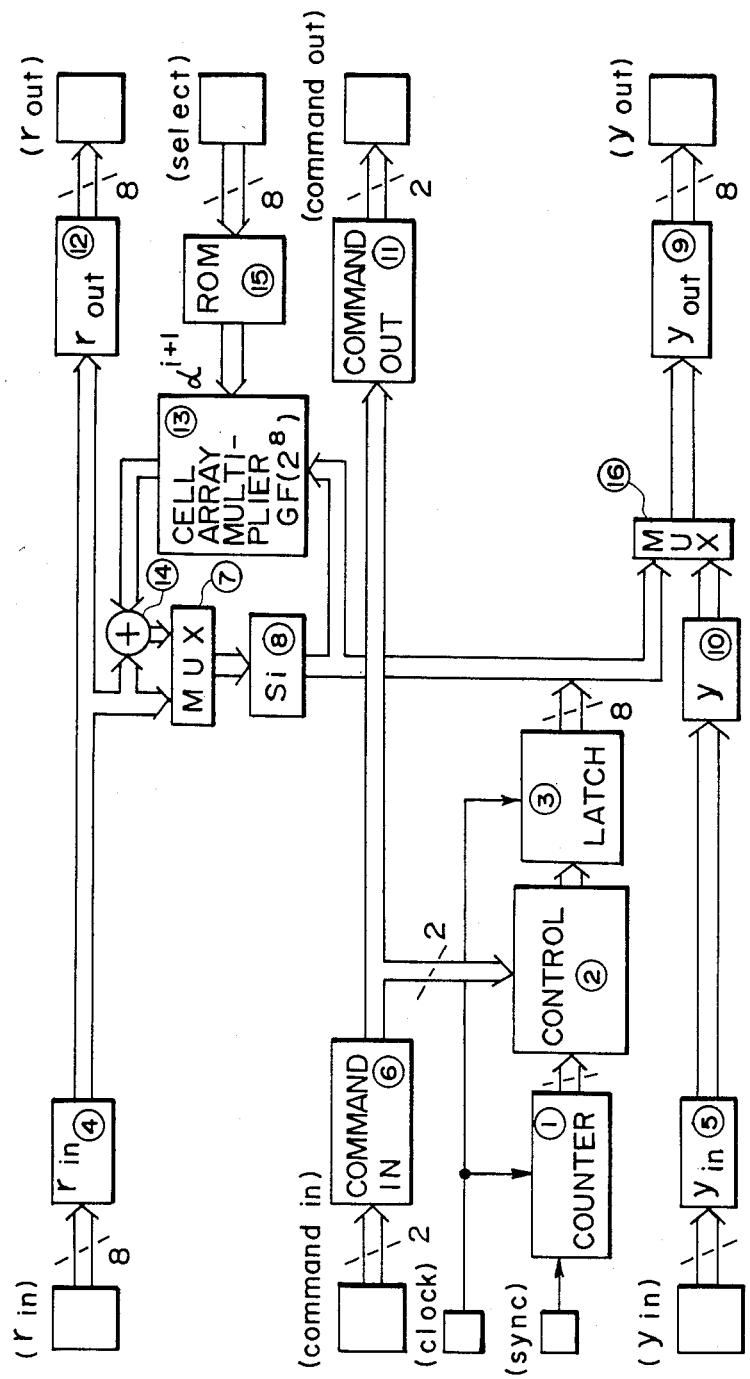
FIG. 6 is a block diagram showing an arrangement of syndrome cells.

The design of the dedicated cell to realize the function of the above-explained syndrome cell as a hardware will now be described. The syndrome cell function is very simple as compared with the GCD cell, which will be explained later, and fundamentally constituted by only a register, a multiplier, and an adder over GF. However, the control section for synchronization and a register to transfer the output, and the like are also necessary. FIG. 6 shows a practical design of the syndrome cell to process the RS code over GF($2^8$) in consideration of the foregoing point. When considering the operation of the cell in one symbol cycle similarly to the case of the GCD cell, the processing flow is as shown by a timing chart of FIG. 7. (In this case as well, one symbol cycle is divided into sixteen internal cycles.) On the other hand, it is presumed to use "Cellular-Array Multiplier" as the multiplier over GF similarly to the case of the GCD cell. This multiplier has the following scale.

$$\begin{bmatrix} \text{Control section:} & \text{Horizontal microprogram ROM} \\ & \text{512 bits} \\ \text{Coefficient ROM:} & \text{2 kbits} \\ \text{Other gates:} & \text{up to 740 gates} \end{bmatrix}$$

The number of I/O pins is 48. Therefore, this multiplier can be sufficiently constituted as an LSI.

The characteristics of the syndrome cell will be summarized as follows.

(i) The constant $\alpha^{i+1}$ is obtained by reference to the ROM table in response to the "select" command from the outside so that one cell can be used for the calculation of an arbitrary $s_i$.

(ii) The data other than "command" is handled as the vector expressed symbol (eight bit parallel) over GF($2^8$).

(iii) Each cell is controlled by only sync signal "SYNC" and reference clock "CLOCK" (corresponding to the internal cycle).

The "CONTROL" section in FIG. 6 may be realized by a horizontal microprogram ROM.

An explanation will be further made with respect to FIGS. 4 to 8. In step 1 in FIG. 4, command$_{in}$, coefficient data $r_{in}$, and result of the calculation $y_{in}$ are input. In step 2, a check is made to see if command$_{in}$ is "start" or not. If YES, the coefficient data is input ($s=r_{in}$), the data is output ($y_{out}=y$), and the next data is taken in ($y=y_{in}$) in step 3 as shown in FIG. 5.

When command$_{in}$ is "calc" instead of "start" in steps 2 and 4, step 5 follows and $s=s\cdot x+r_{in}$ is calculated (refer to expression 5-10) and $y_{out}=y_1$ and $y=y_{in}$ are calculated, then the data is output or input as it is.

If NO in step 4, on the contrary, command$_{in}$ is "end". Thus, in step 6, $s=s\cdot x+r_{in}$ is executed and when $y_{out}=S$, the value of the syndrome is output (output from the cell of #($2t-1$) in FIG. 5) and the next input $y=y_{in}$ is executed. In step 7, the data is output as it is ($r_{out}=r_{in}$) and the command is also output as it is (command$_{out}$=command$_{in}$). Further, in step 8, $r_{out}$, $y_{out}$, and command$_{out}$ are actually finally output.

As the hardware, in FIG. 6, $r_{in}$ ④, $r_{out}$ ⑫, command$_{in}$ ⑥, command$_{out}$ ⑪, $y_{in}$ ⑤, and $y_{out}$ ⑨ correspond to the inputs and outputs in FIG. 5. Reference numerals ④, ⑫, ⑥, ⑪, ⑤, and ⑨ denote registers to store the input or output data in FIG. 5. A ROM ⑮ denotes a table to select the coefficient $\alpha$ and a cellular (or cell) array multiplier ⑬ corresponds to the section to execute the calculation of the syndrome in FIG. 4.

A counter ① counts sixteen bits of a clock pulse. A controller ② outputs a predetermined control signal in response to a command or the like which is input. A latch ③ is also provided. A register ⑩ stores the data of the intermediate result of the calculation. A multiplexer MUX ⑯ performs the switching regarding the output of the syndrome Si ⑧. A gate portion ⑭ adds the coefficients and a gate portion ⑦ performs the calculating process of the multiplier ⑬.

Figure 8:
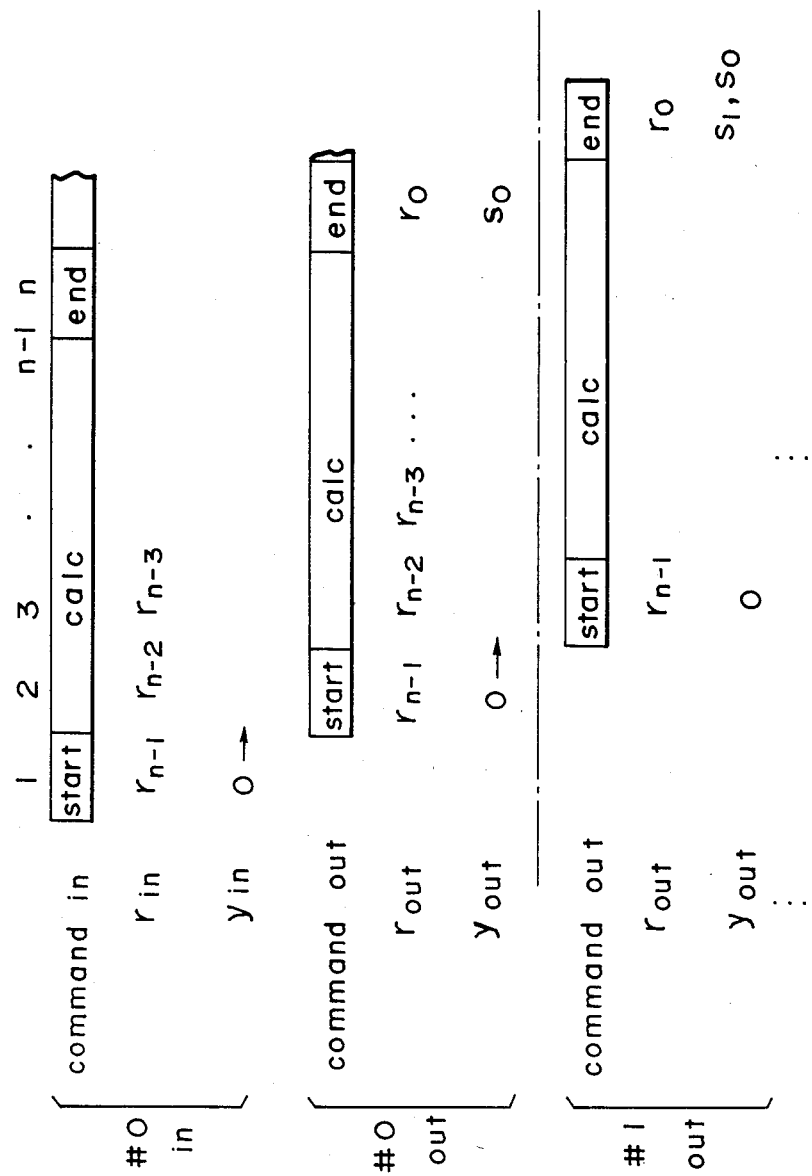
FIG. 8 is a diagram showing timings in the mode of each syndrome cell.

As mentioned above, command$_{in}$ includes "start", "calc", and "end" and their timings are shown in, e.g., FIG. 8. In FIG. 8, numerals 1, 2, 3, - - -, n indicate the number of symbol cycles, respectively. #0, #1, - - - represent the cells in FIG. 5. An explanation will be made with respect to the cell of #0. When the "start" command is now input in the symbol cycle 1, the "start" command is output to the next cell of #1 from 'out' at the timing which is delayed by one cycle. Further, the "start" command is output from the cell #1 at the timing which is likewise delayed by one cycle. In addition, data $r_{n-1}$, - - - is input synchronously with the "start" command. $y_{in}$ is also input as mentioned above. When the "calc" command is then input in the two-symbol cycle, the foregoing syndrome calculation is executed and repeated until the $n-1$ symbol cycle. The "end" command is input in the n symbol cycle and one syndrome is calculated. The processes of #0$_{in}$, #0$_{out}$, and #1$_{out}$ are sequentially executed at the timings which are delayed by one symbol cycle at a time, respectively. At last, when the process ends at the cell #1, in the case where the data is finally output, S$_1$ is output by the "end" command and thereafter S$_0$ is output.

Figure 7:
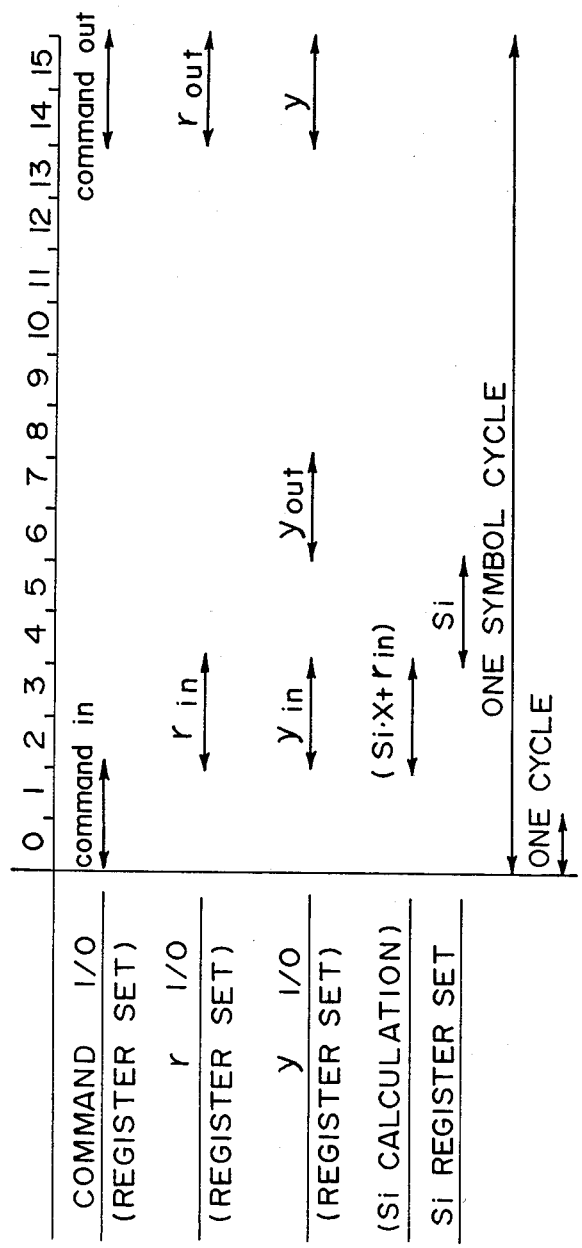
FIG. 7 is a timing chart for a syndrome cell ($S_1$)

FIG. 7 is a detailed explanatory diagram in one symbol cycle of the timing chart shown in FIG. 8. Sixteen bits are counted by the counter ① in FIG. 6. For the input/output of the command, the data is input to the regsiter ⑥ by the zeroth and first clocks and supplied to the register ⑪ by the 14th and 15th clocks.

The output y is input to the $y_{in}$ register 5 by the second and third clocks and stored into the y register 10 by the 14th and 15th clocks in FIG. 7. However, in the case of the "end" command, the value of the Si register 8 is supplied to the $y_{out}$ register 9 under control of the MUX 16. On the other, $SiX+r_{in}$ is calculated by the second and third clocks and Si is set to the register 8 by the fourth and fifth clocks.

CCD

An explanation will then be made with respect to the production of the error position polynomial and error evaluation polynomial shown in step 2.

Constitution of the GCD cell

When applying the systolic algorithm to the decoding of the RS code, the decoding step (2), i.e., the production of the error position polynomial $\sigma(x)$ and error evaluation polynomial $\omega(x)$ becomes the most serious problem. The algorithm for the decoding step 2 and the design of the dedicated cell (hereinafter, referred to as a GCD cell) to realize this algorithm as a hardware will then be described.

Fundamental algorithm

First, as mentioned above, the algorithm to produce the polynomials $\sigma(x)$ and $\omega(x)$ results in the extention GCD problem. Namely, when $x^{2t}$ is replaced by the polynomial $A_0$ and the symdrome polynomial $S(x)$ (expression (2-32)) is replaced by the polynomial $B_0$ (deg $A_0=2t$ and deg $B_0=2t-1$), if the polynomials D and W which satisfy $$\begin{bmatrix} \deg W < t, \deg D \le t \\ C \cdot A_0 + D \cdot B_0 = W \end{bmatrix} \quad (5\text{-}1)$$

are obtained during the process to obtain GCD [$A_0$, $B_0$], D indicates the error position polynomial $\sigma(x)$ and W represents the error evaluation polynomial $\omega(x)$, respectively. It is known that such polynomials $\sigma(x)$ and $\omega(x)$ are unconditionally determined excluding the difference of their constant coefficients. Therefore, the following polynomials A, B, U, V, L, and M are defined as follows $$\begin{bmatrix} A = U \cdot A_0 + L \cdot B_0 & (5\text{-}2) \\ B = V \cdot A_0 + M \cdot B_0 & (5\text{-}3) \end{bmatrix}$$

for the polynomials $A_0$ and $B_0$ and their initial values are set as follows.

$$U = M = 1; L = V = 0; (A = A_0, B = B_0)$$

Figure 9:
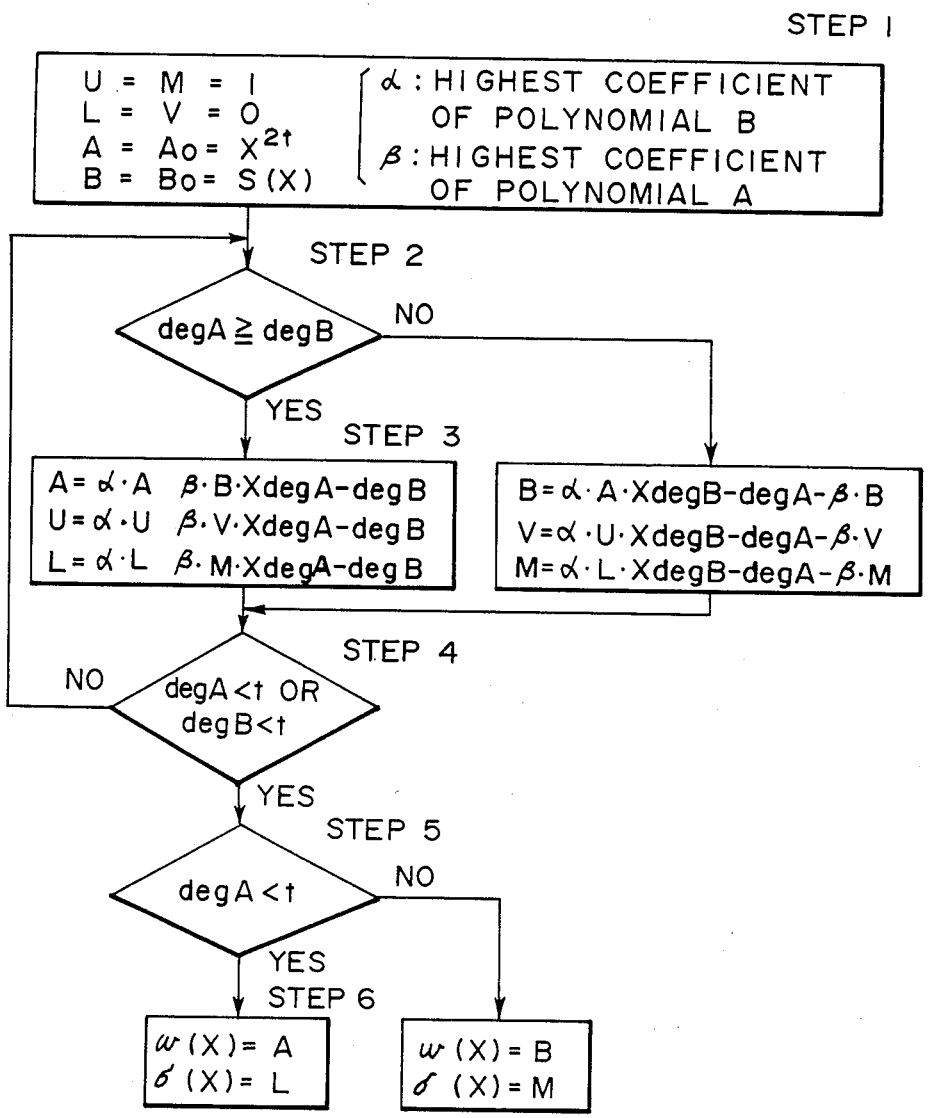
FIG. 9 is a flowchart for producing $\sigma(x)$ and $\omega(x)$ due to an extension GCD problem.

Then, the repetitive step in FIG. 9 is executed and when the relation of deg A (deg B) becomes smaller than t, A (B) and L (M) are obtained as $\omega(x)$ and $\sigma(x)$, respectively. In the method of FIG. 9, the division over GF in the repetitive step is omitted by alternately multiplying the highest coefficient $\alpha$ of the polynomial B and the highest coefficient $\beta$ of the polynomial A to the polynomials A and B, respectively. (Refer to expressions (2-41) and (2-43).) The essential problem doesn't occur with respect to the values of $\sigma(x)$ and $\omega(x)$ by such a method as well.

FIG. 9 will be further explained. First, in step 1, $U = M = 1$, $L = V = 0$, $A = A_0$, and $B = B_0$ and the initial values are set. In step 2, a check is made to see if deg $A \ge $ deg B or not. In step 3, the polynomials A and B are alternately multiplied with the highest coefficients $\beta$ and $\alpha$ of the polynomials A and B, respectively, thereby omitting the division over GF in the repetitive step of expressions (2-41) and (2-43).

In step 4, when the values of deg A and deg B become smaller than a predetermined degree, steps 5 and 6 follow and the calculations of $\omega(x) = A$, $\sigma(x) = L$, $\omega(x) = B$, and $\sigma(x) = M$ are executed.

Figure 10:
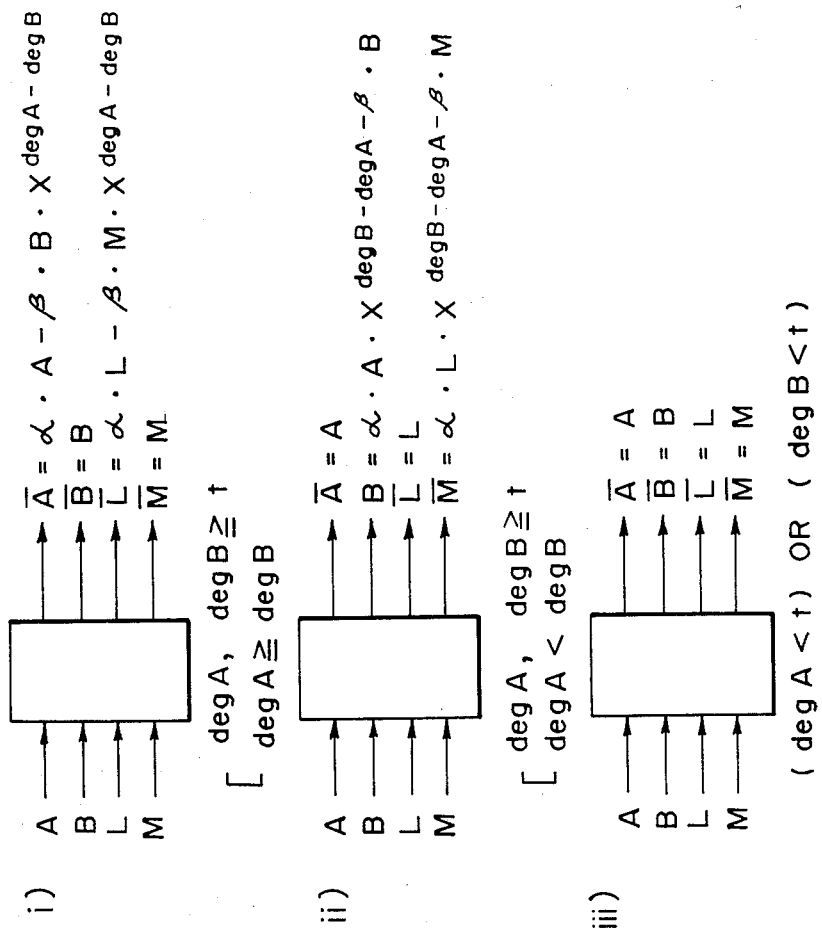
FIG. 10 is a diagram showing a conceptional model of the GCD cell.

When the concept of the systolic algorithm is then applied to the repetitive step in FIG. 9 and the repetative step is executed once for one GCD cell, the conceptional model of this cell is as shown in FIG. 10.

In FIG. 10, the polynomials are input from the left side of the cell and the polynomials subjected to the processes according to the degrees of the polynomials A and B are output from the right side. In FIG. 10, $\overline{A}$, $\overline{B}$, $\overline{L}$, and $\overline{M}$ represent output polynomials for the input polynomials A, B, L, and M, respectively.

(Since the polynomials U and V are unnecessary for the decoding of the RS code, they will not be mentioned any more later.)

As shown in FIG. 10, the GCD cell to execute the repetitive step in FIG. 9 needs three kinds of execution modes responsive to the degrees of the polynomials A and B and these modes are hereinafter referred as follows.

(i) degA, degB $\ge$ t and degA $\ge$ degB—"reduce A"
(ii) degA, degB $\ge$ t and degA $\ge$ degB—"reduce B"
(iii) degA < t or degB < t—"nop"

Fundamental model of the GCD cell

The cells as shown in FIG. 10 are one-dimensionally arranged to constitute one cell array and the repetitive step in FIG. 9 is executed, so that the polynomials $\sigma(x)$ and $\omega(x)$ can be produced due to the pipeline process. However, it is the problem that the lengths of the polynomials change during the process. For example, when an attention is paid to one cell:

(i) In the cell mode of "reduce A", the degree (length) of A decreases and the degree (length) of L increases due to the cell.

(ii) In the cell mode of "reduce B", the degree (length) of B decreases and the degree (length) of M increases due to the cell.

When it is intended to allow the function of the cell to correspond to the change in length of the input polynomial as mentioned above, the very complicated process is required for each cell. In this case, the calculated amounts of the individual cells in the cell arrays become ununiform or the like, so that the efficiency is bad. To solve this problem, according to systolic algorithm to solve the extension GCD problem of Kung et al, the inputs of the polynomials to each cell are divided into the individual coefficient data and the difference between the degrees of the polynomials A and B. However, to actually apply this algorithm to the decoding of the RS code, the practical degree data of each polynomials is needed to distinguish the foregoing three modes. (The degrees of L and M are also necessary as the degree of the error position polynomial.) Further, it is also necessary to mutually align the terms corresponding to the degrees of the individual polynomials and sequentially input the coefficient data to each cell from the high order data and to separately perform the process of the coefficient data and the process of each degree. In this case, to uniform the calculated amounts of the respective cells, a change in degree of A or B in one cell must be restricted to up to one degree. Due to this, the terms of deg A and deg B of A and B are not always proportional. However, if the term of deg A (deg B) of A (B) in the "reduce A" "(reduce B)" mode is zero, no problem will be caused by performing the operation to merely shift A to the higher order. In addition to those coefficient data and degree data, data "start" indicative of the head of data is also needed. At this time, when each cell receives "start=1", it recognizes the start of data and sets the state of process from the degree deg A and deg B of A and B and terms of deg A and deg B. The cell also processes the coeffifent data and calculates the new degree in order to send them to the next cell. In addition, each cell repeats the same process in accordance with the state until the next "start=1" is received.

To cope with the change in the length of the polynomial, it is sufficient to provide a delay for a buffer for each cell and execute the following processes.

In the "reduce A" mode:

B and L are transferred at the same speed as that of "start", A is transferred earlier than B by one, and M is transferred later than L by one.

In the "reduce B" mode:

A and M are transferred at the same speed as that of "start", B is transferred earlier than A by one, and L is transferred later than M by one.

(Example)

In the case where $$\deg A = i, \deg B = j, i \geq j, i, j > t \quad (5\text{-}4)$$

$$A = (a_i, a_{i-1}, \ldots, a2, a1, a0)$$

(In accordance with the sequence of the high order)

$$B = (b_j, b_{j-1}, \ldots, b1, b0) \quad (5\text{-}5)$$

$$(\alpha = b_j \text{ and } \beta = a_i)$$

$$A = 0, \alpha \cdot a_{i-1} - \beta \cdot b_{j-1}, \alpha \cdot a_{i-2} - \beta \cdot b_{j-2} \quad (5\text{-}6)$$

$$\deg A = \deg A - 1 \quad (5\text{-}7)$$

$$B = B \quad (5\text{-}8)$$

$$\deg B = \deg B \quad (5\text{-}9)$$

→ A is transferred earlier than B by one.

As will be understood from this example, in the actual data process, the calculation to multiply $x^{\deg A - \deg B}$ and the like are unnecessary.

Figure 11:
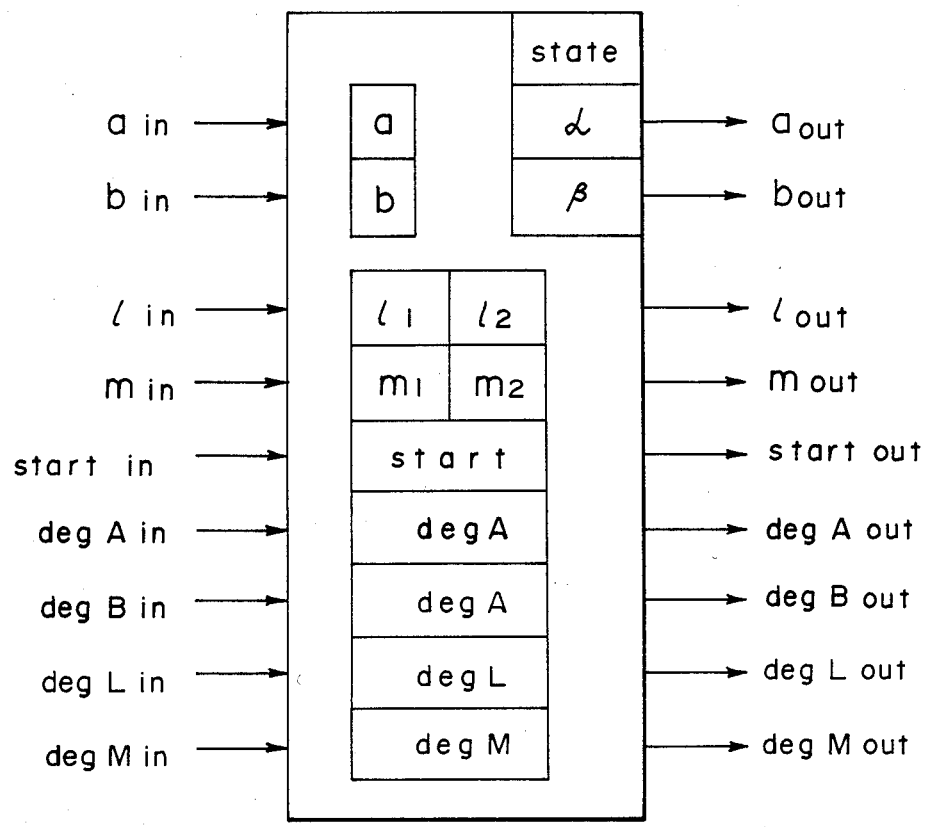
FIG. 11 is a diagram showing a fundamental model of the GCD cell.

The fundamental model of the GCD cell to realize the above-mentioned point is as shown in FIG. 11.

In FIG. 11, $a_{in/out}$, $b_{in/out}$, $l_{in/out}$, and $m_{in/out}$ denote I/O ports of the coefficient data of the respective polynomials A, B, L, and M. Start$_{in/out}$ denote I/O ports of "start" indicative of the head of data. deg A$_{in/out}$, deg B$_{in/out}$, deg L$_{in/out}$, and deg M$_{in/out}$ denote I/O ports of the degree data of the respective polynomials. Reference characters a, b, $l_1$, $l_2$, $m_1$, $m_2$, deg A, deg B, deg L, and deg M shown in the cell represent delays for buffers respectively. $\alpha$ and $\beta$ are registers to store the necessary constants when the repetitive step shown in FIG. 9 is executed. 'state' indicates a register to store the mode in each cell during the execution of the repetitive step.

Figure 12:
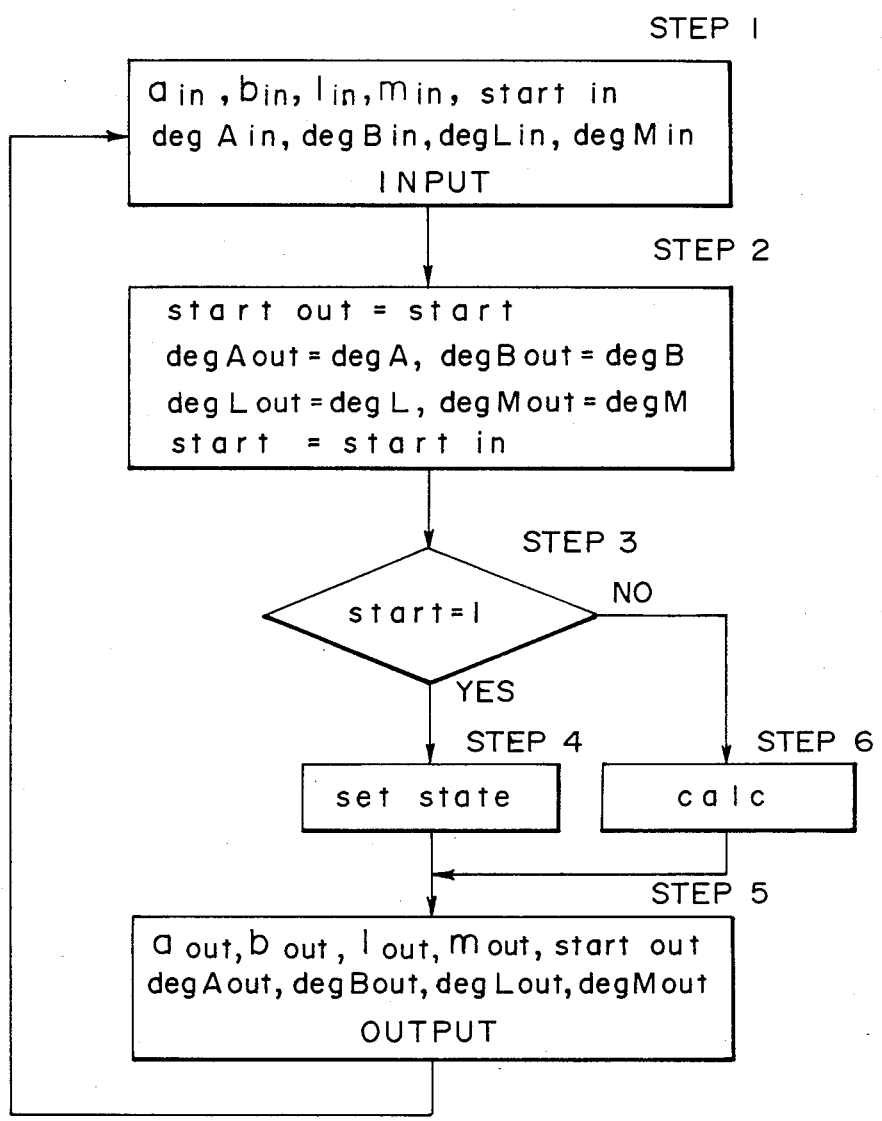
FIG. 12 is a processing flowchart for the whole fundamental model of the GCD cell.
Figure 13:
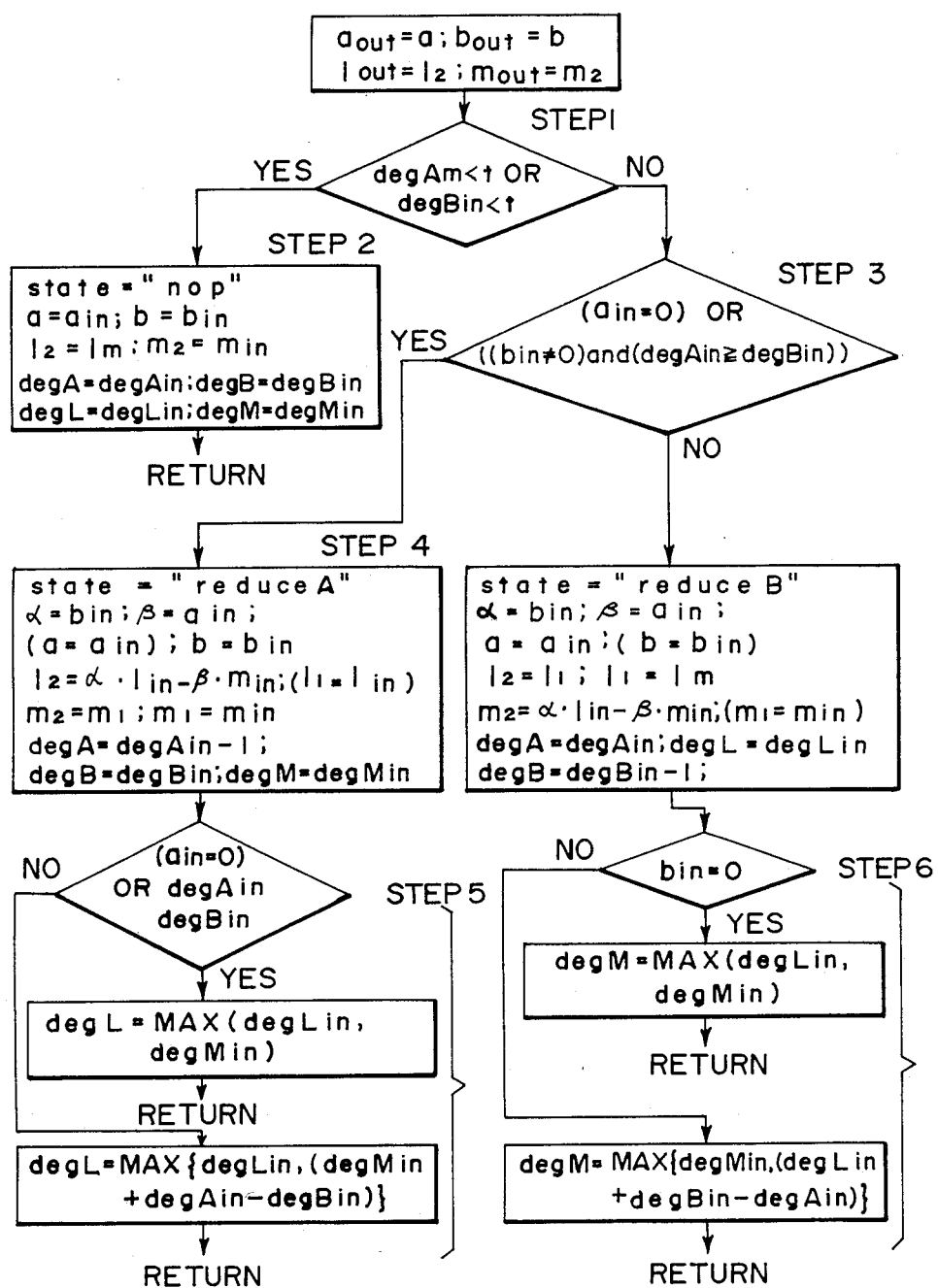
FIG. 13 is a processing flowchart for a set state mode of the fundamental model of the GCD cell.
Figure 14:
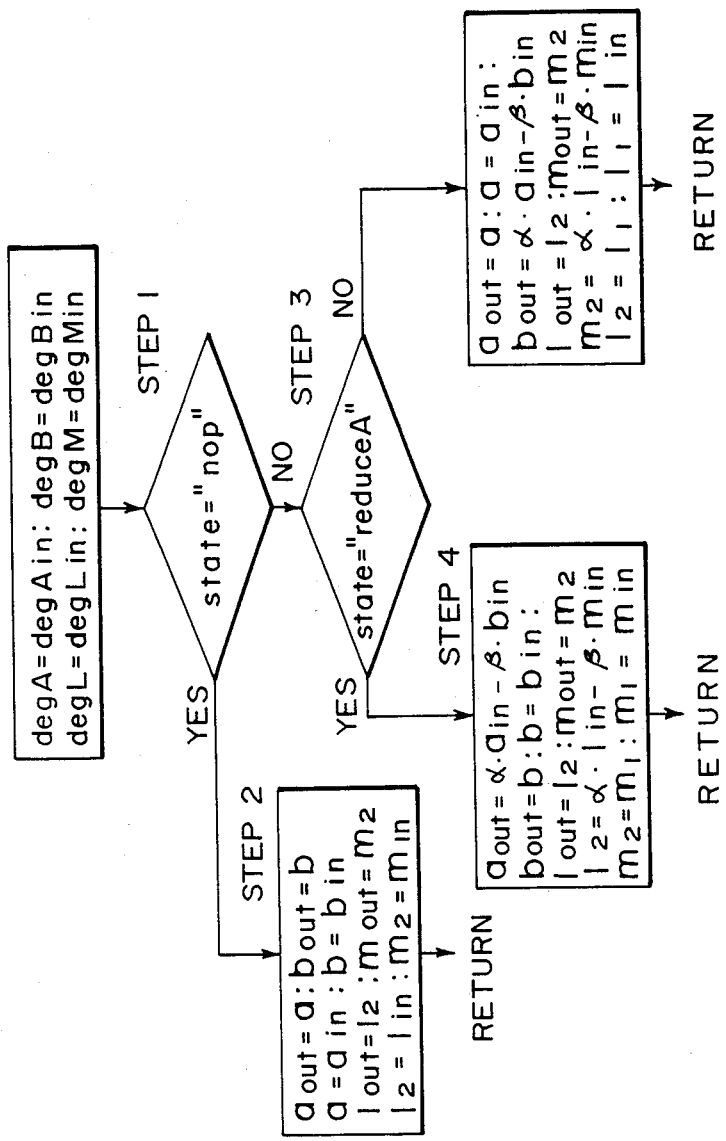
FIG. 14 is a processing flowchart in the calculating mode of the GCD cell.

Next, the CCD cell fundamental model of FIG. 11 repeats a processing flow shown in FIG. 12 for the interval from the input of "start=1" at a predetermined timing until the input of next "start=1", thereby carrying out the process corresponding to the repetitive step in FIG. 9 of one time. In FIG. 12, when "start=1", the cell executes the "set state" mode to recognize the start of data and set "state", $\alpha$, $\beta$, etc.. In addition, when "start≠1", the cell execute the "calc" mode to perform the process responsive to "state". FIGS. 13 and 14 show detailed processing flows in the respective modes.

It should be noted that when "start" which is added to the head of data and the degrees deg A deg B, deg L, and deg M of the respective polynomials pass through one cell, they certainly pass through the delay once. Consequently, it takes two symbol cycles (one symbol cycle denotes the input cycle of the data) for the data to pass through one cell. On the other hand, since the heads of the coefficient data of the respective polynomials are aligned in correspondence to the change in length, the number of delays which are used to transfer the data changes in accordance with the kinds of processes. As shown in FIG. 11, one delay is prepared for A and B and two delays are prepared for L and M. To clearly understand how to use the delays, the speed at which "start" passes through the cell array is used as a reference speed and the passing speeds of the coefficient data of the polynomials in each "state" will be summarized in Table 1.. In Table 1, the respective speeds (1, 2, 3) having the following meanings 3  Passes through one cell without passing through any delay.
2  Passes through one cell via one delay. (The same speed as that of "start)
1  Passes through one cell via two delays.

TABLE 1

|  | "nop" | "reduce A" | "reduce B" |
|---|---|---|---|
| A | A = A | $\overline{A} = \alpha A - \beta B x^{\deg A - \deg B}$ | $\overline{A} = A$ |
| (speed) | (2) | (3) | (2) |
| B | B = B | $\overline{B} = B$ | $\overline{B} = \alpha A x^{\deg B - \deg A} - \beta B$ |
| (speed) | (2) | (2) | (3) |
| L | L = L | $\overline{L} = \alpha L - \beta M x^{\deg A - \deg B}$ | $\overline{L} = L$ |
| (speed) | (2) | (2) | (1) |
| M | $\overline{M} = M$ | $\overline{M} = M$ | $\overline{M} = \alpha L x^{\deg B - \deg A} - \beta M$ |
| (speed) | (2) | (1) | (2) |

Connection of the GCD cells

To actually execute the decoding steps (2) and obtain $\sigma(x)$ and $\omega(x)$ from $A_0 = x^{2t}$ and $B_0 = S(x)$, it is necessary to constitute the cell array in which the GCD cells are one-dimensionally connected as mentioned above. In this case, it is sufficient to reduce the degree of A or B by only one of each cell. However, to obtain $\sigma(x)$ and $\omega(x)$, the repetitive step in FIG. 9 must be executed until either one of degrees of the initial values $A = A_0$ (deg $A = 2t$) and $B = B_0$ (deg $B = 2t - 1$) becomes $(t-1)$. Therefore, up to $(2t+1)$ cells are necessary. This point is shown in (#0 to #2t) in FIG. 15. The following initial values are inputted to the left ends of the cell array.

$$\begin{bmatrix} A = A_0 = x^2t(1, 0, 0, \ldots, 0); & \deg A = 2t, 0, 0 \ldots 0 \\ B = B_0 = S(x)(s_{2t-1}, \ldots, s_1, s_0); & \deg B = 2t - 1, 0, 0 \ldots 0 \\ L = 0 \quad (0, 0, 0, \ldots 0); & \deg L = 0, 0, 0, \ldots 0 \\ M = 1 \quad (1, 0, 0, \ldots 0); & \deg M = 0, 0, 0, \ldots 0 \\ \text{start} \quad (1, 0, 0, \ldots 0) & \end{bmatrix}$$

On the other hand, it takes two symbol cycles for the data to pass through one cell as mentioned above. Therefore, there is the delay of $2 \cdot (2t+1)$ symbol cycles for the interval from the start of input of the data to the left ends of the cell array until the start of output of the results to the right ends. With the connection shown in FIG. 15, the results which are output from the cells at the right ends certainly become $\deg A = t-1$ ($\deg B = t-1$) and the coefficient data of A (B) is output from the term of $(t-1)$ degree (it is not always non-zero). However, the degree $\deg L$ ($\deg M$) of L (M) is variable depending on the number of errors since the number of errors in the reception word is one (it is assumed that $1 \leq t$) and the output of the coefficient data also starts from the term of one degree (non-zero).

Further, the data which is given to the decoding step 3) differs in dependence on whether the output of the cell at the right end has $\deg A = t-1$ or $\deg B = t-1$. Therefore, a slight amount of interface is needed between the GCD cell array and the cell array to execute step 3).

$(\deg A = t-1 \rightarrow \sigma(x) = L, \; \omega(x) = A;$ $\deg B = t-1 \rightarrow \sigma(x) = M, \; \omega(x) = B)$

Practical design of the GCD cell

In this case, the dedicated cell to realize the hardware of the function of the GCD cell mentioned above is designed. First, the foregoing GCD cell fundamental model is the improvement of the model proposed by Kung et al to solve the extension GCD problem, thereby allowing the fundamental model improved to be actually applied to the decoding of the RS code. Although this model is sufficient in the case of realizing as a software, if it is intended to constitute this model as a hardware as it is and produce one cell as one chip, it is actually fairly difficult because the number of I/O ports is too large.

Figure 16:
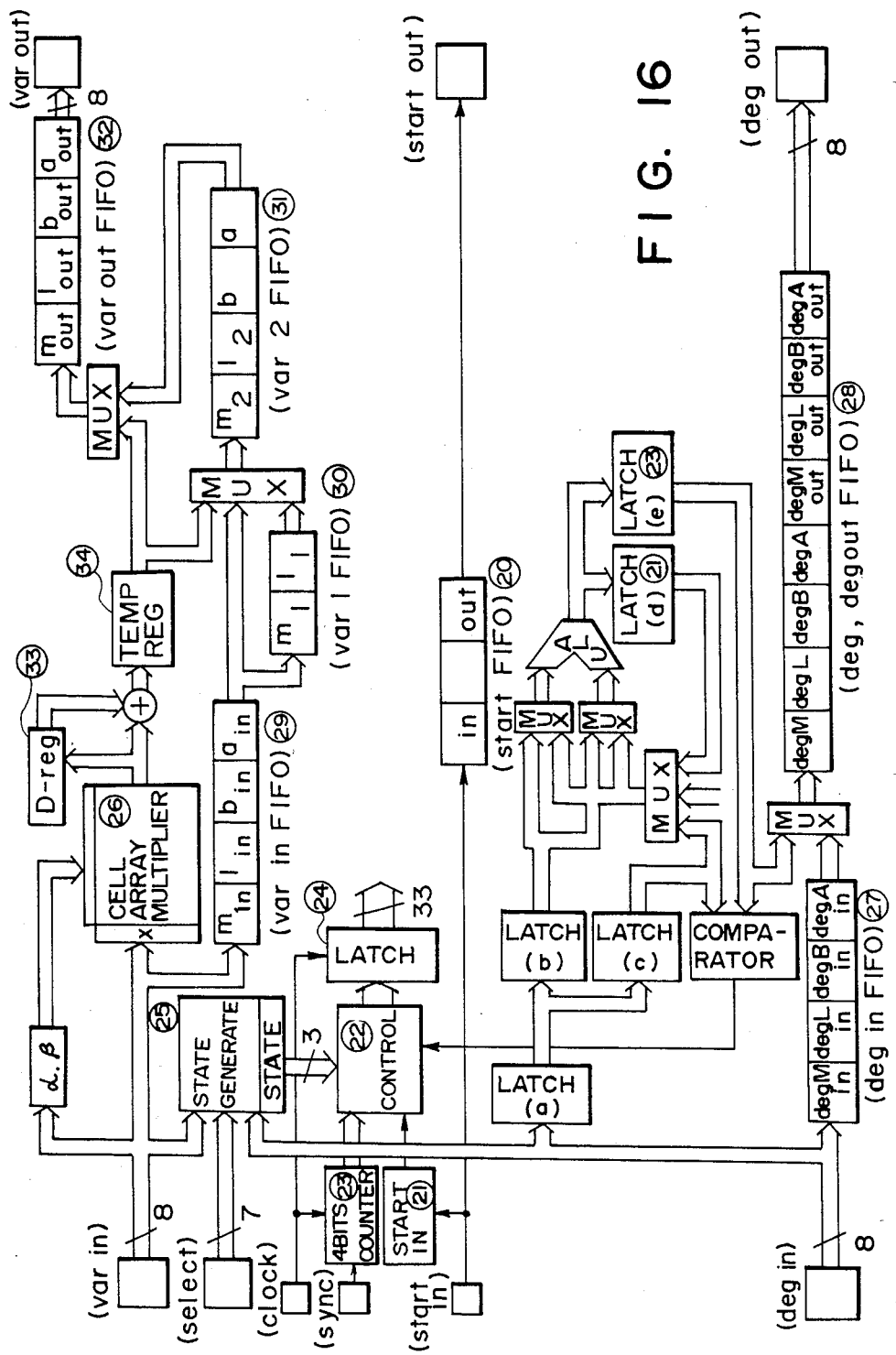
FIG. 16 is a detailed block diagram showing a practical arrangement of the GCD cell.

It should be noted that the coefficient data and degree data of the polynomials A, B, and M are not necessarily simultaneously input or output. Therefore, by time-sharingly inputting or outputting the coefficient data and degree data of each polynomial as "var" and "deg", the number of I/O pins necessary for one cell can be reduced. On the other hand, when considering the area in one cell which is occupied by the multipliers over GF which are needed for the process of the coefficient data, it is desirable to use only one. Various kinds of constitutions of the multipliers over GF are considered. The GCD cell to handle the Rs code over $GF(2^8)$ is practically designed in consideration of the speed, occupied area, regularity of constitution. This practical design is shown in FIG. 16. The operation necessary for the cell constitution of FIG. 16 will now be considered in correspondence to FIGS. 12 to 14 showing the operation of the GCD cell fundamental model. The flow of process in one symbol cycle (input cycle of start$_{in}$) is shown in a timing chart of FIG. 17. One symbol cycle is divided into sixteen internal cycles. "Preset" and "deg compute" shown in the diagram are executed only when "start$_{in}$=1". The calculation of "$\alpha \cdot a_{in} - \beta \cdot b_{in}$" is performed only when "start$_{in} \neq 1$".

The characteristics of the GCD cell constitution will be summarized as follows.

(i) The input/output data of the coefficients ($a_{in/out}$, $b_{in/out}$, $l_{in/out}$, $m_{in/out}$) in FIG. 11 are set to var$_{in}$ and var$_{out}$, and the input/output data of the degrees (deg $A_{in/out}$, deg $B_{in/out}$, deg $L_{in/out}$, deg $M_{in/out}$) are set to deg$_{in}$ and deg$_{out}$, and the input and outputs are multiplexed, thereby reducing the number of I/O pins necessary for one cell.

(ii) The coefficient data is handled as the vector expressed symbol (eight bit parallel) over $GF(2^8)$. The degree data is handled as the integer (eight bit parallel) which is expressed by a binary number of eight bits.

(iii) the delays necessary in the cell shown in FIG. 11 are replaced by FIFO buffers and the internal data processes are executed as the pipeline process in accordance with the multiplexing of the inputs and outputs. For example, the calculations such as "$\alpha \cdot a_{in} - \beta \cdot b_{in}$" and "$\alpha \cdot l_{in} - \beta \cdot m_{in}$" necessary for the process of the coefficient data can be efficiently performed using one multiplier over GF. On the other hand, the calculations of integers such as "deg $A_{in} - 1$", "deg $B_{in} - 1$", "deg $L_{in}$ + deg $B_{in}$ − deg $A_{in}$", and "deg $M_{in}$ + deg $A_{in}$ − deg $B_{in}$" necessary for the process of the degree data can be efficiently executed using one ALU.

(iv) A degree t of error correcting capability necessary to set "state" can be input by "select" from the outside such that it can be used to decode an arbitrary RS code over $GF(2^8)$.

(v) Each cell is controlled by only the synchronizing signal "SYNC" and reference clock "CLOCK" (corresponding to the internal cycle).

(vi) The procedure to set the data into each FIFO buffer is determined on the basis of the values of "state" and "start$_{in}$" of each cell in a manner similar to FIGS. 12 to 14. The "CONTROL" section in FIG. 16 may be realized by a horizontal microprogram ROM. The "state generate" section may be constituted by a combination circuit consisting of a comparator which receives $a_{in}$, $b_{in}$, deg $A_{in}$, deg $B_{in}$, and "select".

The hardware and flowcharts shown in FIGS. 11 to 17 will then be described in detail with reference to mainly FIGS. 16 and 17.

As described in FIGS. 6 and 7, in one symbol cycle, a start FIFO ㉚ is first set and at the same time, the heads $a_i$, $b_j$, $l_k$, $m_k$, i, j, k, and l of the data A, B, L, M, deg A, deg B, deg L, and deg M are input. When explaining further in detail, a start signal is set to a start$_{in}$ register ㉑ and input to a control ㉒. One symbol cycle is divided into sixteen internal cycles which are triggered by the sync signal. These sixteen internal cycles are obtained by counting the clocks by a four-bit counter ㉓. An output of four bits is input to an address of the control (ROM) ㉒. Thirty-three bits of an output of the control ㉒ are latched by a latch ㉔ at every clock and sent to each section, thereby controlling the sixteen internal cycles.

In FIG. 12, when "start"=1 in step 3, the mode becomes "set state" in step 4 and the mode to set $\alpha$ and $\beta$ and the like is executed. In steps 1, 2, and 5, the data is input to output.

FIG. 13 is a flowchart in the "set state" mode in step 4 in FIG. 12. In step 1, a check is made to see if deg $A_{in}$ or deg $B_{in}$ is smaller than t or not. If YES, (state)="nop" and the processing routine is returned to step 1. If NO in step 1, step 3 follows and the degree is discriminated. In the next step 4, state="reduce A" or "reduce B" is set and deg $L_{in}$, deg $M_{in}$, deg $A_{in}$, and deg $B_{in}$ are calculated. In step 5, deg L or deg M is obtained.

The "calc" mode shown in step 6 in FIG. 12 will then be described with reference to the flowchart of FIG. 14.

In step 1, a check is made to see if the precedent state in the flowhcart of FIG. 12 is "nop" or not. If YES, step 2 follows. If NO, step 3 follows and a check is made to see if state="reduce A" or not and then step 4 follows, respectively.

The state generate shown in FIGS. 12, 13, and 14 is performed by a state generate ㉕ in FIG. 16. Various kinds of multiplications are executed by a cellular array multiplier ㉖. Reference numerals ㉗ to ㉜ denote FIFO buffers, respectively, and ㉝ is a delay register.

Figure 17:
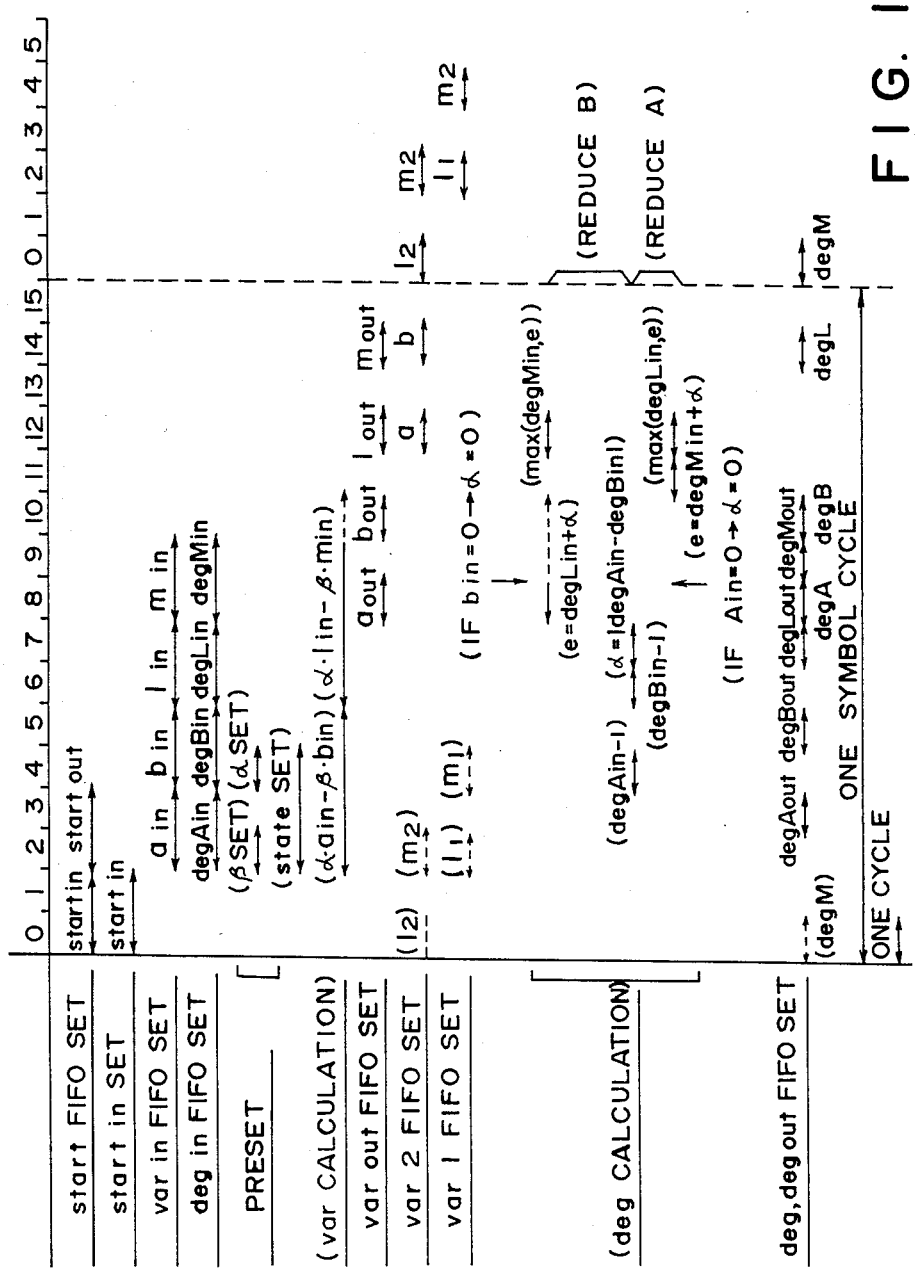
FIG. 17 is a timing chart in one symbol cycle of the GCD cell.

FIG. 17 is an explanatory diagram in one symbol cycle. First, in the case of one symbol cycle, the foregoing $start_{in}$ is executed by the zeroth and fisrt clocks (start=1) and the values of a, b, l, and m are inputted until the second to ninth clocks. $l_2$ and $m_2$ are set to the var 2 FIFO ㉛ by the zeroth and second clocks. At first, $l_2=m_2=0$. Next, $l_1$ and $m_1$ are set to the var 1 FIFO ㉚. At first, $l_1=m_1=0$. The value of $var_{in}$ is set to the $var_{in}$ FIFO ㉙ and $a_{in}=a_i$, $b_{in}=b_j$, $l_{in}=l_k$, and $m_{in}=m_k$ are set. Further, the value of $deg_{in}$ is set to the $deg_{in}$ FIFO ㉗ and deg $A_{in}=i$, deg $B_{in}=j$, deg $L_{in}=k$, and deg $M_{in}=k$ are set.

In the state generate ㉕, the above-mentioned state (nop, reduce A, reduce B) and the like are set and the case where state="reduce A" will now be described here. Thereafter, the $deg_{out}$ FIFO ㉘ is set, and $\alpha=b_j$ and $\beta=a_i$ are set.

Since the first output is 0 in the first symbol cycle, deg $A_{out}=0$, deg $B_{out}=0$, deg $L_{out}=0$, and deg $M_{out}=0$. In the $var_{out}$ FIFO ㉜ as well, $a_{out}$, $b_{out}$, $l_{out}$, $m_{out}$ are set to 0.

Next, $\alpha \cdot a_i$ and $\beta \cdot b_j$ are calculated from the cellular array multiplier. $\alpha \cdot a_i - \beta \cdot b_j$ is calculated by the D reg ㉝ and a Temp reg ㉞ is set. The deg $L_{in}$, deg $M_{in}$, abFIFO ㉛ are set by latches (a), (b), and (c) and MUX, ALU, and latches (d) and (e) connected after the latches (a) to (c), thereby setting $a=a_i$ and $b=b_j$.

Next, the second symbol cycle will be described. The var 2 FIFO ㉛, start FIFO ㉙, var 1 FIFO ㉚, $var_{in}$ FIFO ㉙, and $deg_{in}$ FIFO ㉗ are set in a manner similar to the above. However, in this case, $l_2=\alpha \cdot l_k - \beta \cdot m_h$, $m_2=m_1=0$, start=0, $l_1=l_k$, $m_1=m_h$, $a_{in}=a_{i-1}$, $b_{in}=b_{y-1}$, $l_{in}=l_{k-1}$, $m_{in}=m_{h-1}$, deg $A=B\mu=L\mu=N\mu=0$. Next, since start=0, the apparatus enters the "calc" mode the calculation according to the state in the first symbol cycle is performed. In this case, since the case where state=reduce A' is considered, $\alpha \cdot a_{i-1}$ and $\beta \cdot b_{j-1}$ are calculated by the cell array multiplier, $\alpha \cdot a_{i-1}=\beta \cdot b_{j-1}$ is calculated by D reg, and the resultant data is set into the Temp reg ㉞. In a manner similar to the above, $\alpha \cdot l_{k-1} \cdot \beta \cdot m_{h-1}$ is set into the Temp reg ㉞. Then, deg $A_{out}$=deg A, deg $B_{out}$=-deg R, deg $L_{out}$=deg L, deg $M_{out}$=deg$_m$, $a_{out}=\alpha - a_{i-1} \cdot \beta - b_{j-1}$, $b_{out}=b_y$, $l_{out}=\alpha l_h=\beta m_h$, $m_{out}=0$ are set into the $deg_{out}$ FIFO ㉘ and $var_{out}$ FIFO ㉜. Since start=0, deg Compute sets the last abFIFO ㉛ executed to $a=a_{i-1}$ and $b=b_{j-1}$.

The values which are set into the deg FIFO ㉘, $var_2$ FIFO ㉛, and $var_{out}$ FIFO 32 are determined by the MUX.

Similarly, in the third symbol cycle, deg$A_{out}$, deg$B_{out}$, deg$L_{out}$, deg$M_{out}$, $a_{out}$, $b_{out}$, $l_{out}$, and $m_{out}$ are outputted, so that the delay of two symbol cycles is caused.

Constitution of the Evaluation cell

The EVAL cell in the decoding steps (3) and (4) will then be described.

An explanation will then be made with respect to the systolic algorithm to execute the estimation of the error position and error values in the decoding steps (3) and (4) in consideration of the interface with the GCD cell. An explanation will be also made with regard to the design of the dedicated cell to execute that algorithm as a hardware (hereinafter, this cell is referred to as the Evaluation cell).

Algorithm

As mentioned above, in the decoding step (3), it is necessary to execute the calculations for sequentially substituting the elements $\alpha^{-j}$ (j=n-1, - - -, 2, 1, 0) of $GF(2^m)$ by which the RS code is defined for the three polynomials of the error position polynomial $\sigma(x)$, error evaluation polynomial $\omega(x)$, and differential $\sigma'(x)$ of $\sigma(x)$ which were derived in step (2), and thereby to obtain those values. (In this case, the reception symbols are input in accordance with the sequence from the high degree term of the reception word polynomial. Namely, $r_j$ are input in accordance with the sequence of j=n-1, - - - 2, 1, 0. Therefore, it should be noted that in the description with respect to step (3), the sequence of substitution of $\alpha^{-j}$ (j=n-1, - - -, 2, 1, 0) is reversed.). Consequently, the function which is required for the Evaluation cell array to realize it is to sequentially receive, from the high degree, the coefficients of the respective polynomials of $\sigma(x)$, $\omega(x)$, and $(\sigma'(x))$ which are given from the side of the GCD cell array and to sequentially substitute $\alpha^{-j}$ (j=n-1, - - -, 2, 1, 0) for those coefficients, and thereby to output the resultant values. As the practically necessary calculations, the variables are merely substituted for the polynomials and the resultant values are merely obtained. Thus, the repetitive algorithm similar to expression (5-10) can be used. For example, the calculation of t-degree polynomial f(x) is developed as follows.

$$f(x) = f_t x^t + f_{t-1} x^{t-1} + \quad (5\text{-}11)$$
$$\ldots + f_1 x + f_0$$
$$= [\ldots \{(f_t x + f_{t-1})x + f_{t-2}\}x + \quad (5\text{-}12)$$
$$\ldots + f_1]x + f_0$$

In the syndrome calculation, each cell preliminarily has x to be substituted and the coefficient is given to each cell. In this case, since the coefficients are preliminarily known here, the systolic algorithm to solve the DFT can be used as it is. However, the coefficients of the respective polynomials $\sigma(x)$, $\omega(x)$, and $(\sigma'(x))$ are given from the side of the GCD cell array in accordance with the sequence from the high-degree term. To cope with this problem, it is sufficient to solve the following expressions in place of expressions (5-11) and (5-12).

$$f(x) = x^{-t} = f_t + f_{t-1} x^{-1} + \ldots + \quad (5\text{-}13)$$
$$f_1 x^{-(t-1)} + f_0 x$$
$$= [\ldots \{(f_0 x^{-1} + f_1) x^{-1} + \quad (5\text{-}14)$$
$$f_2\} x^{-1} + \ldots + f_{t-1}] x^{-1} + f_t$$

This means that $x^{-1}$ is substituted for the polynomial $\bar{f}(x)$ in which the respective coefficients of f(x) were inversed.

$$f(x) = f_0 x^t + f_1 x^{t-1} + \ldots + f_{t-1} x + f_t \quad (5\text{-}15)$$

Even if $\sigma(x)$, $\omega(x)$, and $(\sigma'(X))$ are solved by this method as well, no problem will be caused in the estimation of the error positions mentioned in the description of step (3) and in the calculation of expression (2-50).

In this case, the degree of $\sigma(x)$ is certainly set to t and the degree of $\omega(x)$ is certainly set to (t−1). (The term of zero is handled as zero. The degree of $\sigma'(x)$ is also set to (t−1).) To solve the foregoing algorithm, the sum of products calculation of one repetitive calculation of expression (5-14) must be assigned to one cell as shown in FIG. 18.

In FIG. 18, $f_1$ denotes a register to store the coefficient of i-degree of the polynomial f(x). $x_{in}$ and $x_{out}$ denote I/O ports of the data over GF which is input to the polynomial. $f_{in}$ and $f_{out}$ also denote I/O ports to transfer the result of the sum of products calculation of one time. Further, command$_{in}$ and command$_{out}$ denote I/O ports of the commands which are given to the cell. Tow kinds of commands are now considered.

First, since the Evaluation cell array must load the coefficients of the polynomial f(x) to each cell before starting the calculation, a command of "load" is necessary. The number of cell to be loaded needs to be included in "load" in order to inform to which cell the data is loaded. Further, since the cell can start the sum of products calculation upon completion of the loading of the data, a command of "calc" is needed for this purpose. Next, the functions necessary for the cell of FIG. 18 are as shown in FIG. 19.

Each cell loads the necessary coefficient data when the command is "load". Each cell executes the sum of products calculation "$f_{in} \cdot x_{in} + f_1$" of one time of expression (5-14) from $x_{in}$, $f_{in}$, and $F_1$ and transfers the results when the command is "calc".

Connection of the Evaluation Cells

Figure 20:
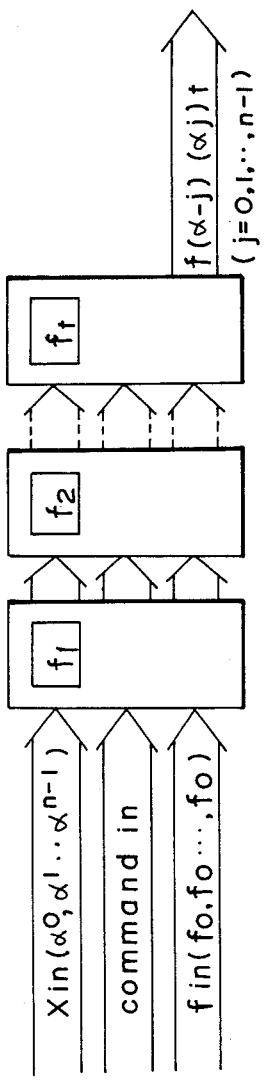
FIG. 20 is a block diagram in the case where the evaluation cell is connected.

The sum of products calculation of one time of expression (5-14) is executed by one Evaluation cell shown above. Therefore, to solve the t-degree f(x), t cells must be one-dimensionally connected as shown in FIG. 20. There is a delay of t symbol cycles (one symbol cycle is the input cycle of data) when $f_t$ to $f_1$ are loaded to t cells, respectively. There is the delay of t symbol cycles for the interval from the start of input of $\alpha^j$ (j=n−1, ---, 2, 1, 0) after completion of the loading of the data until the start of output of the first result $f(\alpha^{-j}) \cdot (\alpha^j)^t \cdot x_{in}$ has no meaning while the coefficient data is being loaded. Also, the values which are output from the right ends of the cell array for the t symbol cycles until the first result is output after completion of the loading have no meaning. Therefore, the effective values of $x_{in} = \alpha^j$ (j=n−1, ---, 2, 1, 0) are input after the end of loading. On the other hand, $f_0$ must be always continuously input to $f_{in}$ at the left end during the execution of the repetitive calculation. Since there are a plurality of cells, "load" is performed with the deviation of about one symbol cycle due to the cells.

Practical design of the Evaluation cell

Figure 21:
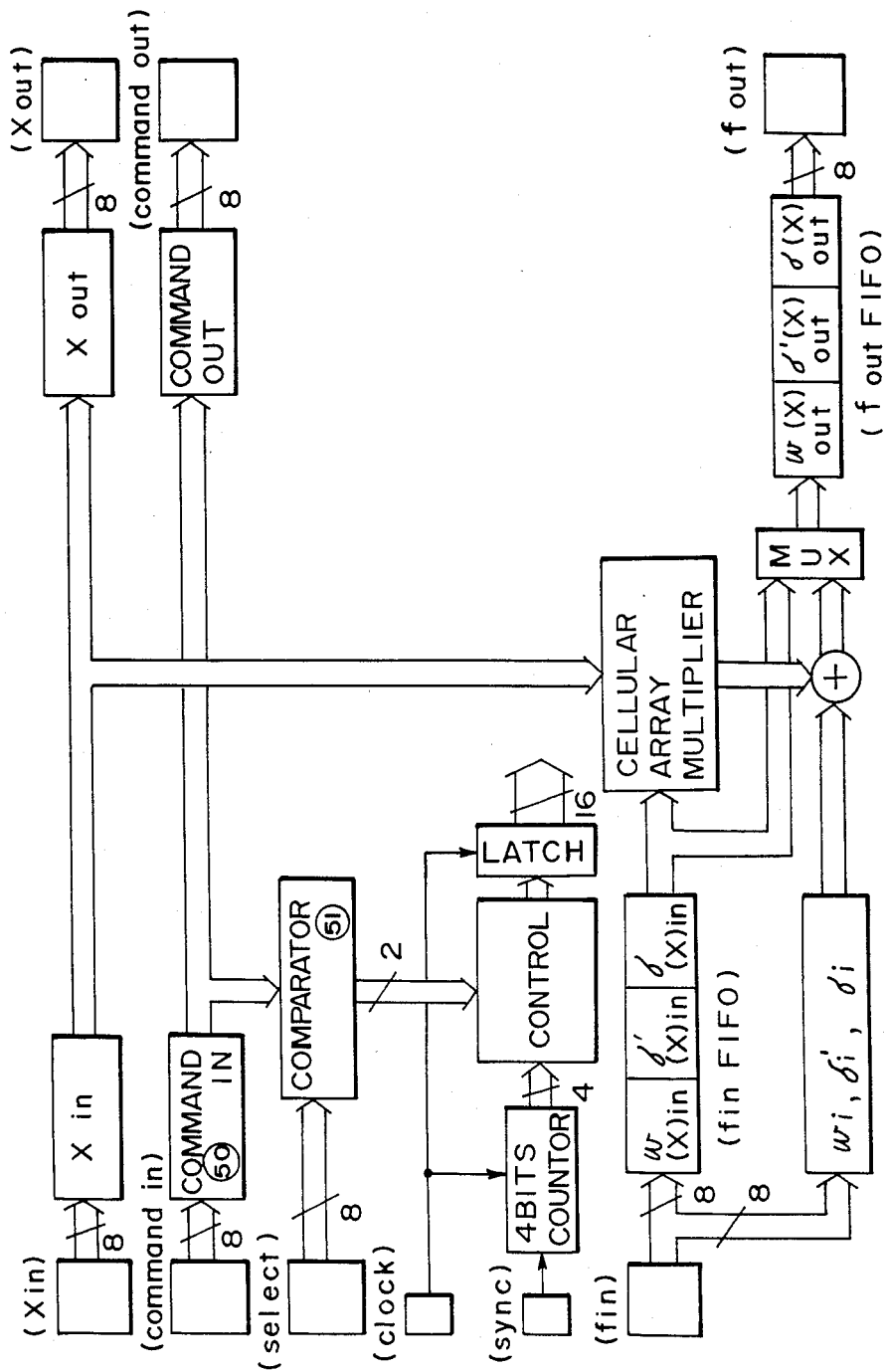
FIG. 21 is a block diagram showing an arrangement of the evaluation cell.

The dedicated cell to realize the function of the above-mentioned Evaluation cell as the hardware is designed. It should be noted that all of the calculations of $\rho(x)$ (t degree including the term of zero as well), $\omega(x)$ ((t−1) degree including the term of zero as well), and $\sigma'(x)$ ((t−1) degree including the term of zero as well) can be solved by the same algorithm as described above. Therefore, the practical fundamental model of the Evaluation cell of FIG. 18 may be designed and the cell array for each polynomial may be constituted. However, since the function of the Evaluation cell is very simple, it is desirable to time-sharingly multiplex the input and output data similarly to the case of the GCD cell and thereby to enable the sum of products calculation at the same degree of $\sigma(x)$, $\omega(x)$, and $\sigma'(x)$ to be executed by one cell. Although the Evaluation cell can be fundamentally constituted by only the register to store the coefficient data and multiplier and adder over GF, the control section for synchronization and register to transfer the result of the calculation are further needed. FIG. 21 shows a practical design of the Evaluation cell to handle the RS code over GF($2^8$) in consideration of the above point. When considering the operation of the cell in one symbol cycle (one symbol cycle is the input cycle of the command) similarly to the case of the GCD cell or syndrome cell, the flow of the process is shown in a timing chart of FIG. 22, (In this case as well, one symbol cycle is divided into sixteen internal cycles.) It is presumed that the "Cellular Array Multiplier" is used as the multiplier over GF similarly to the case of the GCD cell.

To execute the sum of products calculation at the same degree of $\sigma(x)$, $\omega(x)$, and $\sigma'(x)$ by the same cell, $f_{in}$ and $f_{out}$ in FIG. 18 are commonly used for the coefficient data of those three polynomials.

($\sigma(x)_{in/out}$, $\omega(x)_{in/out}$, $\sigma'(x)_{in/out}$, respectively)

The data other than "command" is handled as the vector expressed symbol (eight bit parallel) over FG($2^8$).

Three registers to store the coefficient data $f_1$ shown in FIG. 18 are prepared for the coefficient data of three polynomials. ($\sigma_i$, $\omega_i$, $\sigma'_i$, respectively)

The register to store the input/output data is constituted by the FIFO in accordance with the multiplexing of the input/output data and the sum of products calculation for each polynomial is efficiently executed by one multiplier over GF.

The degree to which the cell is assigned can be input by "select" from the outside so that the cell can be used to decode an arbitrary RS code over GF($2^8$).

Each cell is controlled by only the synchronizing signal "SYNC" and reference clock "CLOCK" (corresponding to the internal cycle).

The "CONTROL" section in FIG. 21 may be realized by a microprogram ROM. The degree which is handled by the cell is sufficient for the practical "command" and it can be determined by use of a comarator. ("command=0"→"calc", "command≠0"→"load" (Cell#))

An explanation will then be made with respect to FIG. 19. In step 1, a check is made to see if "load" is inputted to a command in ㊿ or not (by a comparator ㊿ in FIG. 21). If YES, the cell of a predetermined number is selected by a selection signal which is supplied after the "load" signal (step 2). Then, $f_i=f_{in}$ is set in step 3 and the resultant data is output in step 4.

In NO in step 1, namely, the command is "calc (calculation)", the calculation of $f_{out}=f_{in}\cdot x_{in}+f_i$ is executed in step 5 and the resultant data is output in step 6.

Figure 22:
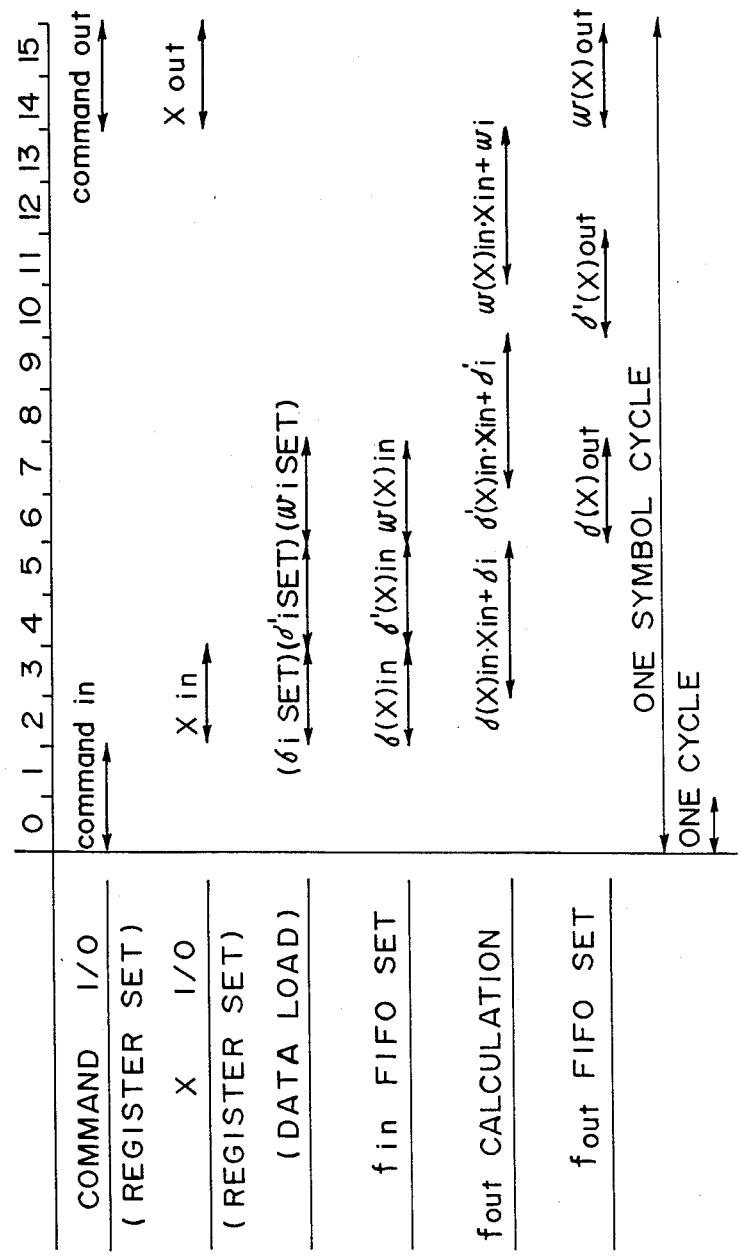
FIG. 22 is a timing chart in the evaluation cell.

The calculation in step 5 is performed by the cellular array multiplier in FIG. 21. FIG. 22 is a detailed explanatory diagram in which one symbol cycle is divided into sixteen clocks as mentioned above.

System constitution

As described above, the systolic algorithms to execute the three decoding steps of the RS (Reed Solomon) code have been examined. The dedicated cells of "GCD cell", Syndrome cell", and "Evaluation cell" have been designed. The decoder system actually constituted by use of those cells becomes a one-dimensional cell array as shown in FIG. 23.

(The code having the code length $n2^8-1$ and (arbitrary) error correcting capability t defined over $GF(2^8)$ is handled and it is assumed that the reception symbols $r_{n-1}, ---, r_1, r_0$ are input in accordance with this sequence.)

The output $f_{out}$ of the Evaluation cell # (t−1) is input to a circuit "Error Pattern generate & GATE" to realize the error pattern calculation and gate function. (This section may be constituted by individual TTL and the like.) This means that although t Evaluation cells are necessary for the calculation of $\sigma(x)$, only (t−1) Evaluation cells are needed for the calculations of $\sigma'(x)$ and $\omega(x)$, and while the Evaluation cell of #t is executing the sum of products calculations of t degree of $\sigma(x)$, the calculation "$-\omega(x)\cdot\sigma'(x)^{-1}$" of expression (2-50) may be performed by this circuit.

The reception symbols $(r_{n-1}, ---, r_1, r_0)$ which are input to the left ends of the syndrome cell array are simultaneously stored into the buffer memory in accordance with this sequence. These symbols are sequentially output in accordance with this sequence in response to the start of output of $\sigma(\alpha^{-j})\cdot(\alpha^j)^t$ $(j=n-1, ---, 1, 0)$ from the Evaluation cell #t. At this time, if "$\sigma(\alpha^{-j})\cdot(\alpha^j)^t=0$", the error of $$-\{\omega(\alpha^{-j})\cdot(\alpha^j)^{t-1}\}\cdot\{\sigma'(\alpha^{-j})\cdot(\alpha^j)^{t-1}\}^{-1}=-\omega(\alpha^{-j})\cdot\sigma'(\alpha^{-j})^{-1} \quad (5\text{-}16)$$

occurs in $r_j$ as already described in conjunction with the decoding method. Therefore, by opening the gate and adding the calculated value to $r_j$, the correction can be performed.

Next, the characteristics of this system are that each cell operates synchronously in one symbol cycle consisting of sixteen internal cycles and the decoding processes can be all performed by the pipeline processes. Although a few interfaces (which are constituted by individual TTL and the like) are necessary between the respective cell arrays, the whole process can be fundamentally controlled on the basis of only "SYNC" and "CLOCK" to control each cell. The delay time which is taken for the decoding processes (namely, the time after $r_{n-1}$ was input to the left end of the syndrome cell array until $\sigma(\alpha^{-j})\cdot(\alpha^j)^t(j=n-1)$ is output from the Evaluation cell of #t and $r_{n-1}$ can be corrected) changes depending on the constitution of the interfaces. However, the delay time of the cell array itself becomes $$N+2t+2(2t+1)+2t=N+8t+2(\text{symbol cycles}) \quad (5\text{-}17)$$

The functions necessary for the respective interfaces will be briefly explained as follows.

Syndrom→GCD;

The beginning and end of syndrome are determined from the output "command" from the syndrome cell of #(2t−1), and the data "$\text{start}_{in}$", "$\text{var}_{in}$", and "$\text{deg}_{in}$" which are given to the GCD cell of #0 are time-sharingly produced on the basis of the output from "$y_{out}$".

GCD→Evaluation;

The start of output of $\omega(x)$ is determined from the output "$\text{start}_{out}$" from the GCD cell of #2t, and either $\sigma(x)$ or $\omega(x)$ is selected on the basis of "$\text{deg}_{out}$", then the data $\text{command}_{in}$" and "$f_{in}$" which are given to the Evaluation cell of #0 are time-sharingly produced. Simultaneously, $x_{in}$ is required to a GF data TABLE (ROM).

To perform the continuous decoding processes, it is sufficient to ignore the correcting process in the vain symbol cycles (t symbol cycles from the end of loading of the coefficient data until the start of output of the first $\sigma(\alpha^{-j})\cdot(\alpha^j)^t(j=n-1, \ldots)$ in the Evaluation cell.

As mentioned in the item of the constitution of the syndrome cell, the reception symbols $r_{n-1}, \ldots, r_1, r_0$ are input to the syndrome cell in accordance with this sequence, and the correction is also executed in accordance with this sequence as well. Therefore, the correcting processes of the last $r_{t-1}, \ldots, r_1, r_0$ are ignored. However, since this portion is the check symbol portion as shown in the item of the encoding, no problem will be caused.

Evaluation

The foregoing various kinds of systolic algorithms and cells and the decoder system of the RS code which is constituted by using them will now be evaluated.

First, to estimate realization of three cells of "GCD cell", "Syndrome cell", and "Evaluation cell" to handle the RS code over $GF(2^8)$ shown above, the number of gates necessary for each constitution, capacity of the horizontal microprogram ROM for control, number of I/O pins, and the like will be summarized in Table 2.

TABLE 2

| | Scale of Each Cell | | | |
|---|---|---|---|---|
| | Horizontal microprogram ROM for control | Other ROM | Number of logic gates other than ROM | Number of I/O pins |
| GCD cell | 16863 bits | | about 3400 | 45 |
| Syndrome cell | 512 bits | 2048 bits (Coefficient ROM) | about 1000 | 48 |
| Evaluation cell | 1024 bits | | about 1600 | 60 |

The cells having these scales can be sufficiently constituted as one-chip LSI, respectively. The reasons why the scale of each cell is relatively simplified as described above are because the symbols over GF are handled as the vector expressed 8-bit parallel data, "Cellular Array Multiplier" is used as the multiplier, and at the same time the internal processes of each cell are performed due to the pipeline processes. (The addition is realized by exclusive OR for each bit) Although not shown in FIGS. 16, 6 and 21 illustrating the practical constitutions of the respective cells, a synchronizing circuit and a circuit to initialize the FIFO are actually necessary when the operation starts. Table 2 shows the scales including these circuits as well.

The processing speed will then be evaluated. Although it is assumed that each cell operates synchronously in one symbol cycle consisting of sixteen internal cycles (refer to FIGS. 17, 7 and 22), it is considered that it is the "GCD cell" that takes the longest processing time among those cells. Although this processing time varies depending on the method of producing the actual cell, if the cell corresponding to, e.g., a TTL of the S (Schottky) type is constituted, it is estimated that one internal cycle is about up to 50 nsec. (A ROM assumes a bipolar ROM). In this case, since one symbol cycle is 800 nsec, the data transfer speed (including the redundancy data as well) in the decoder system of FIG. 23 becomes 10 MBPS (Mega Bit Per Second).

The decoder system of FIG. 23 handles the RS code having the code length $n=2^8-1$ and (arbitrary) error correcting capability t over $GF(2^8)$ and has the characteristics such that the decoding processes are performed by the pipeline processes due to only the simple control and the number of cells necessary to constitute the system is determined by only the error correcting capability t. However, in the case where the processing speed is not a serious problem, there is no need to use all of the cells ($2t+1$ GCD cells, $2t$ Syndrome cells, t Evaluation cells). By repeatedly using the same cell by use of a buffer memory or the like, the decoder system can be constituted by a smaller number of cells, in other words, at a low cost. In addition, each cell designed as described above can be also used as it is for the compacted code if it is the RS code over $GF(2^8)$ (because the number of necessary cells is determined by only t). Further, it has been mentioned in the description of the system constitution that the correction of the check symbol portion (refer to the item of the encoding) may be ignored in the case of continuously decoding. However, by changing the sequence to request $x_{in}$ which is input to the Evaluation cell of #0 for "GF data TABLE (ROM)", an arbitrary symbol in the reception word can be corrected.

In the second approach, the future realization of VLSI is presumed and the application of the systolic algorithm is considered as the decoder constitution using the feature of the VLSI. In this case, the algorithm proposed to solve the extension GCD problem and DFT has been improved to actually apply it to the decoder of the RS code and an examination has been made with regard to the systolic algorithm to execute three decoding steps of calculation of the syndromes, production of the error position polynomial and error evaluation polynomial, and estimation of the error positions and error values. In addition, it is presumed that an arbitrary RS code (compacted code is possible) over $GF(2^8)$ is handled and the dedicated cell to realize each systolic algorithm by the hardware has been designed. In designing of this cell, the internal processes are performed by the pipeline processes, thereby enabling the constitution of each cell to be simplified. Thus, it has been confirmed that the number of gates and the number of I/O pins of each cell lie within the range of the proper scale adapted to sufficiently realize the one-chip LSI. Further, in the case where the decoder system is constituted as a cell array in which those cells are one-dimensionally arranged and the data is transmitted in one direction, all of the decoding processes can be executed by the pipeline processes due to only the simple control. Although the number of necessary cells in this case is arbitrarily determined by the degree of error correcting capability of the code which is used, if the processing speed is not a serious problem, by repeatedly using a small number of cells using a buffer memory, an economical decoder system can be provided. It is obviously possible that in order to make it possible to also apply the cells of the embodiment to codes other than the RS code over $GF(2^8)$ with a certain extent of generality, a part of cell constitution is replaced by a software and thereby realizing a general system constitution.

In the complete parallel process (histogram cell 107) in FIG. 2, element processors (PE) each having a simple constitution are arranged like a matrix and the calculation of the histogram due to the complete parallel process is well known. However, in the step of obtaining the histogram of images due to this method and then converting this histogram to a desired signal space by a ROM or the like, the vector transformation is performed. The systolic algorithm described in the present invention is the algorithm such that the desired result is obtained by repeating the same operation.

As described in detail above, according to the present invention, it is possible to provide a signal processing apparatus in which the signal processing algorithm in the conventional communication line is modified to the algorithm suitable for the parallel processes and the conventional drawbacks can be eliminated and high efficient error correction can be performed by use of the parallel processor.

As described above, in the case where the concept of the systolic algorithm is applied to the Berlekamp-Massey system and the decoder in which the syndrome producing section is formed as the dedicated cell is constituted, by one-dimensionally arranging only the necessary number of syndrome cells in accordance with the error correcting capability of the code, the processes to produce the syndromes can be all executed by the pipeline processes. In addition, there is the effect such that the cells can be controlled by only the sync signal and reference clock.

As described above, by executing the decoding processes due to the pipeline processes, there is the effect such that the whole control can be also performed by only the reference clock and sync signal although a few interfaces are necessary between the cell arrays to execute each step.

In addition, all of the cells synchronously operate in the same symbol cycle and one symbol cycle may be set to, e.g., up to 800 nsec.

Each step is constituted by the same cell, so that this apparatus is suitable to realize the LSI.

。 Since the error correcting capability increases by merely increasing the number of same cells, there is the effect such that this apparatus is fitted for the multierror correction.

As described above, in the case where the idea of the systolic algorithm is applied to the Berlekamp-Massy system and the decoder in which the GCD section is formed as the dedicated cell is constituted, by one-dimensionally arranging only the necessary number of GCD cells in accordance with the error correcting capability of the code, all of the processes to produce the error position polynomial and error evaluation polynomial can be executed by the pipeline processes. In addition, there is the effect such that the cells can be controlled by only the reference clock and sync signal.

What is claimed is:

1. A signal processing apparatus for processing signals comprising three types of cells which include (1) first cell means for producing syndromes, (2) second cell means for producing an error position polynomial and an error evaluation polynomial, and (3) third cell means for estimating and correcting, errors in position and size in the decoding of a BCH code wherein said cells are one-dimensionally arranged.

2. A signal processing apparatus according to claim 1, wherein said signals are time-sequentially multiplexed in said first cell means, second cell means and third cell means.

3. A signal processing apparatus for processing signals comprising:
encoder means for encoding information from an information source;
a communication line for transmitting the data encoded by said encoder means; and
decoder means for decoding said encoded data transmitted by said communication line,
wherein said decoder means performs the decoding of said encoded data by three steps of (1) calculation of syndromes, (2) production of an error position polynomial and an error evaluation polynomial, and (3) estimation and correction of errors in position and size.

4. A signal processing apparatus according to claim 3, wherein said encoded data is time-sequentially multiplexed in said decoder.

5. A signal processing apparatus for processing signals where with respect to a GCD (greatest common divisor) section to decode BCH code, GCD ($A_0$ and $B_0$) are obtained, wherein $A=UA_0+LB_0$ and $B=VA_0+MB_0$ among polynomials A, B, U, V, L and M for said $A_0$ and $B_0$, comprising:
an input section for inputting said polynomials A, B, L and M;
cells for outputting remainders A and B between said A and B and remainders L and M between said L and M on the basis of said inputs; and
a buffer section connected to said cells for delay to fix a change in degree in said cells.

6. A signal processing apparatus according to claim 5, wherein said signals are time-sequentially multiplexed in said cells.

* * * * *

UNITED STATES PATENT AND TRADEMARK OFFICE
CERTIFICATE OF CORRECTION

PATENT NO. : 4,747,103            Page 1 of 8
DATED : May 24, 1988
INVENTOR(S) : Iwamura, et al.

It is certified that error appears in the above-identified patent and that said Letters Patent is hereby corrected as shown below:

AT [57] IN THE ABSTRACT

Line 4, "proceses" should read --processes--.

IN THE DRAWING

Cover Page Figure, "PROSESSOR" should read
        --PROCESSOR--; and

"SYNDROM" should read --SYNDROME--.
    Fig 2, "PROSESSOR" should read --PROCESSOR--; and
        "SYNDROM" should read --SYNDROME--.
    Fig 5, "comand" should read --command--; and
        "SYNDROM" should read --SYNDROME--
        (three occurrences).
    Fig 21, "4 BITS COUNTOR" should read
        --4 BITS COUNTER--.
    Fig 23, "SYNDROM" should read --SYNDROME--; and
        "SYNDROM--GCD" should read --SYNDROME--GCD--.

COLUMN 1

Line 54, "code the" should read --code because the--.

COLUMN 3

Line 18, "a" should read --an--.
    Line 39, "vecotr" should read --vector--.

UNITED STATES PATENT AND TRADEMARK OFFICE
CERTIFICATE OF CORRECTION

PATENT NO. : 4,747,103  
DATED : May 24, 1988  
INVENTOR(S) : Iwamura, et al.

Page 2 of 8

It is certified that error appears in the above-identified patent and that said Letters Patent is hereby corrected as shown below:

COLUMN 4

Lines 1-2, "characterized" should read --characterize--.
Line 35, "differ each" should read --differ from each--.
Line 45, "$f_{n-1}e_{n-1})$" should read --$f_{n-1}+e_{n-1})$--.

COLUMN 5

Line 33, "$C_{n-k-1})$" should read --$c_{n-k-1})$--.
Line 38, "$C_{n-k-1} \cdot x^{n-k-1}$" should read --$c_{n-k-1} \cdot x^{n-k-1}$--.
Line 45, "$k_{k-1})$" should read --$i_{k-1})$--.
Line 50, "$_1x^{n-1}$" should read --$_1x^{n-1}$--.
Lines 55-56, "genarating" should read --generating--.
Line 58, "polynomial can" should read --polynomial which can--.

COLUMN 6

Line 20, "is generated" should read --generates--.
Line 65, "Hoever," should read --However,--.

COLUMN 7

Line 59, "$a^1(i=1,$" should read --$a^i(i=1,$--;
Line 61, "2.2" should read --2-20--.
Line 62, "$F(\alpha^1)=0$" should read --$F(\alpha^i)=0$--.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

COLUMN 8

Line 62, "sl" should read --$s_i$--; and "eju" should read --$e_{ju}$--.

Line 65, "si$X^i$" should read --$s_i X^i$--; and "ejud$^{ju}$" should read --$e_{ju} \alpha^{ju}$--.

COLUMN 9

Lines 10, 12, and 33, "eju$\alpha^{ju}$" should read --$e_{ju} \alpha^{ju}$-- (all occurrences).

COLUMN 10

Lines 1-7, "A=A- A·B$^{-1}$ ·B"
"B=B"
"A=A"
"B=B- B·A$^{-1}$ ·A" should read

--$\bar{A}$=A-[A·B$^{-1}$]·B--

--$\bar{B}$=B--

--$\bar{A}$=A--

--$\bar{B}$=B-[B·A$^{-1}$]·A--.

Line 8, "( X·Y$^{-1}$ :" should read --([X·Y$^{-1}$]:--.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

COLUMN 11

Line 3, "eju" should read --$e_{ju}$--.
    Line 15, "eju" should read --$e_{ju}$--.
    Line 33, "n=1" should read --n-1--.

COLUMN 14

Line 29, "in" should read --on--.
    Line 33, "regsiter" should read --register--.

COLUMN 15

Line 50-51, "repetative" should read --repetitive--.

COLUMN 16

Line 60, "coeffifient" should read --coefficient--.

COLUMN 17

Line 5, "B and L" should read --$\bar{B}$ and $\bar{L}$--.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

Line 7, "A" should read --$\overline{A}$--.

Line 9, "B" should read --$\overline{B}$--.

Line 9, "M" should read --$\overline{M}$--.

Line 11, "L" should read --$\overline{L}$--.

Line 14, "A and M" should read --$\overline{A}$ and $\overline{M}$--.

Line 15, "B" should read --$\overline{B}$--; and "A" should read --$\overline{A}$--.

Line 17, "L" should read --$\overline{L}$--.

Line 19, "M" should read --$\overline{M}$--.

Line 36, "A" should read --$\overline{A}$--.

Line 38, "deg A = deg A-1" should read --deg $\overline{A}$ = deg $\overline{A}$-1--.

Line 40, "B=B" should read -- $\overline{B}$ = B --.

Line 42, "deg B = deg B" should read -- deg $\overline{B}$ = deg B --.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

COLUMN 18

Line 5, "CCD" should read --GCD--.
    Line 13, "execute" should read --executes--.
    Line 62, "of" should read --for--.

COLUMN 20

Line 18, "(iii) the" should read --(iii) The--.

COLUMN 21

Line 22, "fisrt" should read --first--.
    Line 42, "$\alpha\ a_i$". should read --$\alpha \cdot a_i$--.
    Line 66, " (58) " should read -- (28) --.

COLUMN 23

Line 13, "$f_0 X^t$" should read --$f_0 x^t$--.
    Line 32, "Tow" should read --Two--.
    Line 37, "cell" should read --cells--.
    Line 47, "$F_1$" should read --$f_1$--.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

COLUMN 24

Line 9, "$\rho(x)$" should read --$\sigma(x)$--.
Line 47, "polynomials. ($\sigma_i, \omega_i, \sigma'_i$, respectively)" should read
--polynomials ($\sigma_i, \omega_i, \sigma'_i$, respectively).--.
Line 62, "comarator" should read --comparator--.
Line 63, "("command = 0→" should read
--("command = 0"→ --.

COLUMN 25

Line 20, "n$2^8$-1" should read --n = $2^8$-1--.
Line 55, "be all" should read --all be--.

COLUMN 26

Line 14, "data command$_{in}$" " should read
--data "command$_{in}$"--.
Line 65, "bit)" should read --bit.)--.

UNITED STATES PATENT AND TRADEMARK OFFICE
CERTIFICATE OF CORRECTION

PATENT NO. : 4,747,103

DATED : May 24, 1988

INVENTOR(S) : Iwamura, et al.

It is certified that error appears in the above-identified patent and that said Letters Patent is hereby corrected as shown below:

COLUMN 28

Line 37, "be all" should read --all be--.
    Line 58, "Massy" should read --Massey--.

Signed and Sealed this

Tenth Day of April, 1990

Attest:

HARRY F. MANBECK, JR.

*Attesting Officer*      *Commissioner of Patents and Trademarks*